United States Patent
Lee et al.

(10) Patent No.: US 12,414,289 B1
(45) Date of Patent: Sep. 9, 2025

(54) SEMICONDUCTOR DEVICES HAVING AIR SPACER

(71) Applicant: SAMSUNG ELECTRONICS CO., LTD., Suwon-si (KR)

(72) Inventors: Hyeran Lee, Hwaseong-si (KR); Sohyun Park, Seoul (KR); Kyoungcho Na, Hwaseong-si (KR); Seryeun Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 17/900,321

(22) Filed: Aug. 31, 2022

(30) Foreign Application Priority Data

Nov. 4, 2021 (KR) .................. 10-2021-0150278

(51) Int. Cl.
*H10B 12/00* (2023.01)
(52) U.S. Cl.
CPC ........... *H10B 12/315* (2023.02); *H10B 12/34* (2023.02); *H10B 12/482* (2023.02)
(58) Field of Classification Search
CPC .... H10B 12/315; H10B 12/34; H10B 12/482; H10B 12/485
USPC ........................................ 257/906, 907, 908
See application file for complete search history.

(56) References Cited

U.S. PATENT DOCUMENTS

| | | | |
|---|---|---|---|
| 8,962,472 B2 | 2/2015 | Rho et al. | |
| 9,419,000 B2 | 8/2016 | Kim et al. | |
| 9,425,200 B2 | 8/2016 | Hwang et al. | |
| 9,786,598 B2 | 10/2017 | Kim et al. | |
| 10,546,810 B2 | 1/2020 | Park | |
| 10,644,008 B2 | 5/2020 | Lee et al. | |
| 11,205,652 B2 | 12/2021 | Lee et al. | |
| 11,665,883 B2 | 5/2023 | Heo et al. | |
| 2015/0061134 A1 | 3/2015 | Lee et al. | |
| 2020/0020697 A1* | 1/2020 | Kim | H10B 12/0335 |

(Continued)

FOREIGN PATENT DOCUMENTS

| | | |
|---|---|---|
| KR | 10-2015-0063650 | 6/2015 |
| KR | 10-2020-0079366 A | 7/2020 |
| TW | 202137415 | 10/2021 |

OTHER PUBLICATIONS

Office Action dated May 10, 2023 from the Taiwan Intellectual Property Office for corresponding Taiwanese Patent Application No. 111132927.

(Continued)

*Primary Examiner* — Hoai V Pham
(74) *Attorney, Agent, or Firm* — MORGAN, LEWIS & BOCKIUS LLP

(57) ABSTRACT

A semiconductor device includes: a stack including a conductive structure and an insulation structure stacked on each other on a substrate, wherein the stack extends in a first direction substantially parallel to an upper surface of the substrate; first, second and third spacers sequentially stacked on each other on a sidewall of the stack in a second direction substantially parallel to the upper surface of the substrate and crossing the first direction; and a capping pattern disposed on the second spacer, wherein: the second spacer is an air spacer including air, and an upper surface of a portion of the third spacer is substantially coplanar with an upper surface of the capping pattern.

12 Claims, 27 Drawing Sheets

(56) References Cited

U.S. PATENT DOCUMENTS

2021/0134806 A1 5/2021 Lee et al.
2021/0210432 A1 7/2021 Kim et al.

OTHER PUBLICATIONS

Office Action dated Jun. 16, 2025 issued in corresponding Korean Patent Application No. 10-2021-0150278. (Note: KR 10-2021-0051401 A and KR 10-2016-0012826 A already cited.).

\* cited by examiner

FIG. 2
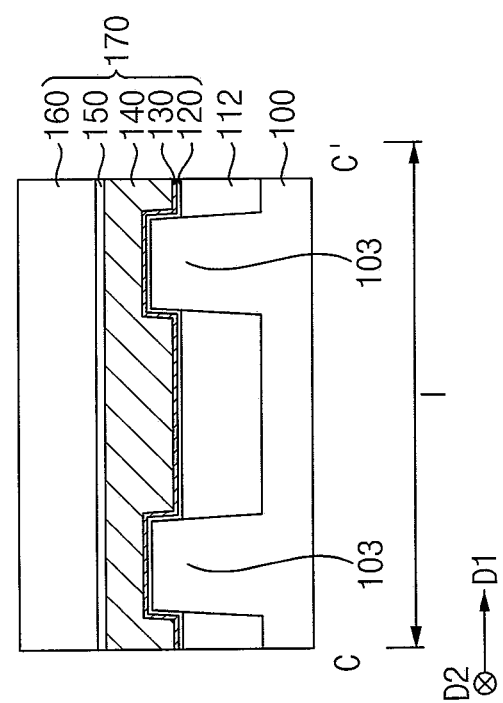
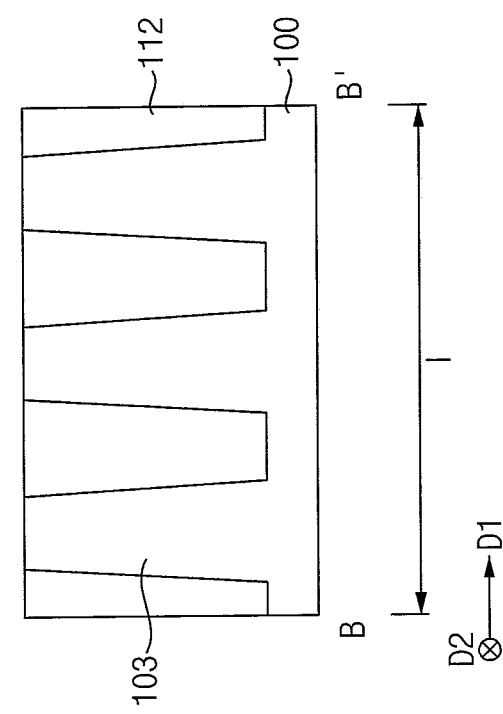

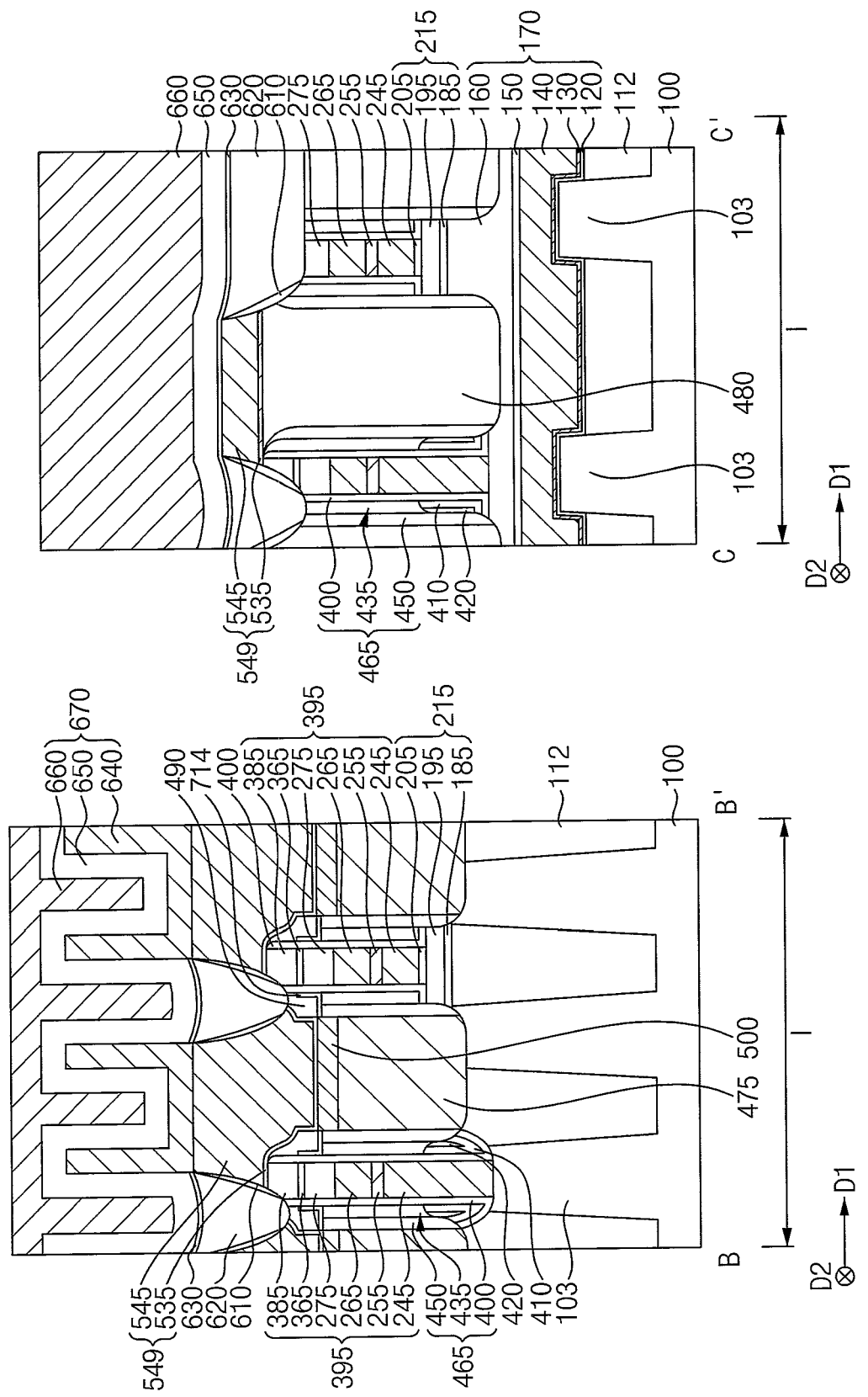

SEMICONDUCTOR DEVICES HAVING AIR SPACER

CROSS-REFERENCE TO RELATED APPLICATION

This application claims priority under 35 U.S.C. § 119 to Korean Patent Application No. 10-2021-0150278 filed on Nov. 4, 2021 in the Korean Intellectual Property Office, the disclosure of which is incorporated by reference herein in its entirety.

TECHNICAL FIELD

Example embodiments of the present inventive concept relate to a semiconductor device. More particularly, example embodiments of the present inventive concept relate to a dynamic random-access memory (DRAM) device.

DISCUSSION OF THE RELATED ART

Generally, in a dynamic random-access memory (DRAM) device, a parasitic capacitance may occur between a bit line structure and a contact plug structure adjacent thereto, and thus, an air spacer may be formed adjacent to the bit line structure. For example, a preliminary spacer structure may be formed on the bit line structure, and a conductive structure may be formed on the preliminary spacer structure. In addition, the conductive structure may be patterned to form an opening exposing a portion of the preliminary spacer structure. The preliminary spacer structure exposed by the opening may be partially removed to form an air gap, and an insulation pattern may be formed in the opening so that the air gap may be transformed into an air spacer.

However, the insulation pattern may permeate into the air gap during the formation thereof, and the air spacer might not have the initial volume of the air gap.

SUMMARY

Example embodiments of the present inventive concept provide a semiconductor device having improved characteristics.

According to an example embodiment of the present inventive concept, a semiconductor device includes: a stack including a conductive structure and an insulation structure stacked on each other on a substrate, wherein the stack extends in a first direction substantially parallel to an upper surface of the substrate; first, second and third spacers sequentially stacked on each other on a sidewall of the stack in a second direction substantially parallel to the upper surface of the substrate and crossing the first direction; and a capping pattern disposed on the second spacer, wherein: the second spacer is an air spacer including air, and an upper surface of a portion of the third spacer is substantially coplanar with an upper surface of the capping pattern.

According to an example embodiment of the present inventive concept, a semiconductor device includes: a stack including a conductive structure and an insulation structure stacked on each other on a substrate in a vertical direction substantially perpendicular to an upper surface of the substrate, wherein the stack extends in a first direction substantially parallel to the upper surface of the substrate; first, second and third spacers sequentially stacked on each other on a sidewall of the stack in a second direction substantially parallel to the upper surface of the substrate and crossing the first direction; and a capping pattern covering upper surfaces of the second and third spacers, wherein: the second spacer is an air spacer including air, and the capping pattern includes a material different from that of the third spacer.

According to an example embodiment of the present inventive concept, a semiconductor device includes: an active pattern disposed on a substrate; a gate structure buried in an upper portion of the active pattern, wherein the gate structure extends in a first direction parallel to an upper surface of the substrate; a bit line structure disposed on the active pattern and extending in a second direction parallel to the upper surface of the substrate and substantially perpendicular to the first direction, first, second and third spacers sequentially stacked on each other in the first direction on a sidewall of the bit line structure; a capping pattern disposed on the second spacer; a fourth spacer disposed on the capping pattern and the third spacer, wherein the fourth spacer contacts an outer sidewall of the first spacer; a contact plug structure disposed on an upper surface of each end portion of the active pattern; and a capacitor disposed on the contact plug structure, wherein: the second spacer is an air spacer including air, and an upper surface of a portion of the third spacer, which is adjacent to the capping pattern, is substantially coplanar with an upper surface of the capping pattern.

The semiconductor device according to an example embodiment may include the air spacer having a sufficient volume, so that the capacitance between neighboring conductive structure, e.g., between the bit line structure and the contact plug structure may decrease, and the contact plug structure including the metal silicide pattern may have enhanced electrical characteristics.

BRIEF DESCRIPTION OF THE DRAWINGS

FIGS. 1, 2, 3, 4, 5, 6, 7, 8, 9, 10, 11, 12, 13, 14, 15, 16, 17, 18, 19, 20, 21 and 22 are plan views and cross-sectional views illustrating a method of manufacturing a semiconductor device according to an example embodiment of the present inventive concept.

FIGS. 24, 25, 26 and 27 are cross-sectional views illustrating a method of manufacturing a semiconductor device according to an example embodiment of the present inventive concept.

DETAILED DESCRIPTION OF THE EMBODIMENTS

Hereinafter, example embodiments of the present inventive concept will be described in detail with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second or third element, component, region, layer or section without departing from the spirit and scope of the present inventive concept.

FIGS. 1 to 22 are plan views and cross-sectional views illustrating a method of manufacturing a semiconductor device according to an example embodiment of the present inventive concept. Particularly, FIGS. 1, 3, 6, 8, 12 and 20 are the plan views, and each of FIGS. 2, 4-5, 7, 9-11, 13-19 and 21-22 includes cross-sections taken along lines B-B' and C-C' of a corresponding plan view.

Hereinafter, in the specification, two directions substantially parallel to an upper surface of a substrate and substantially perpendicular to each other may be referred to as first and second directions D1 and D2, respectively, and a direction substantially parallel to the upper surface of the substrate and having an acute angle with respect to the first and second directions D1 and D2 may be referred to as a third direction D3.

Figure 1:
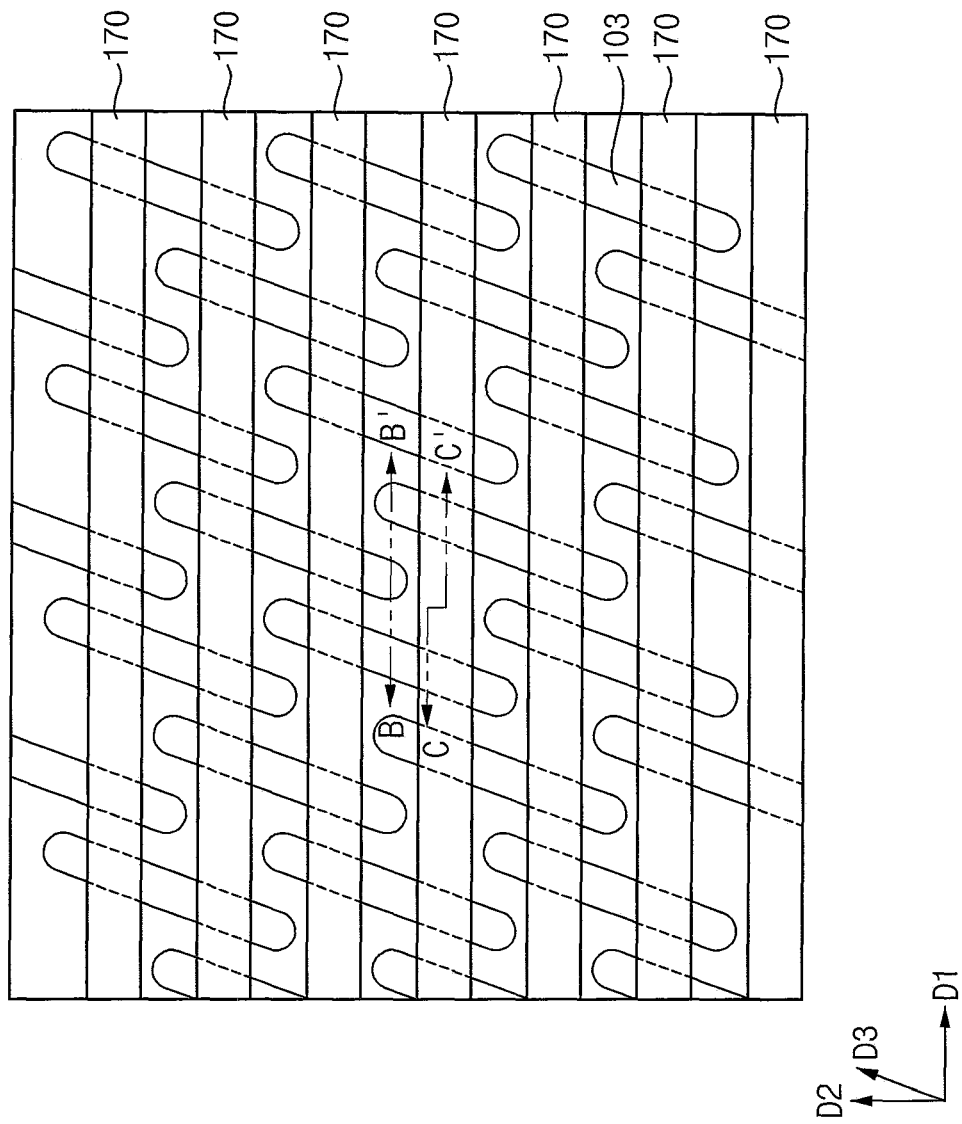

Referring to FIGS. 1 and 2, an active pattern 103 may be formed on the substrate 100, and an isolation pattern 112 may be formed to cover a sidewall of the active pattern 103.

The substrate 100 may include, for example, silicon, germanium, silicon-germanium, or a III-V group compound semiconductor, such as GaP, GaAs, or GaSb. In an example embodiment of the present inventive concept, the substrate 100 may be a silicon-on-insulator (SOI) substrate or a germanium-on-insulator (GOI) substrate.

The active pattern 103 may be formed by removing an upper portion of the substrate 100 to form a first recess, and may extend in the third direction D3, from a plan view. In an example embodiment of the present inventive concept, a plurality of active patterns 103 may be spaced apart from each other in the first and second directions D1 and D2. The isolation pattern 112 may be formed in the first recess, and may include an oxide, e.g., silicon oxide.

The active pattern 103 and the isolation pattern 112 may be partially removed to form a second recess extending in the first direction D1.

A gate structure 170 may be formed in the second recess. The gate structure 170 may include a gate insulation pattern 120, a first barrier pattern 130, a first conductive pattern 140, a second conductive pattern 150 and a gate mask 150. The gate insulating pattern 120 may be disposed on a bottom surface and a sidewall of the second recess. The first barrier pattern 130 may be disposed on a portion of the gate insulation pattern 120 that is disposed on the bottom surface and a lower sidewall of the second recess. The first conductive pattern 140 may be disposed on the first barrier pattern 130 and may fill a lower portion of the second recess. The second conductive pattern 150 may be disposed on the first barrier pattern 130 and an upper surface of the first conductive pattern 140, and the gate mask 160 may be disposed on an upper surface of the second conductive pattern 150 and an upper inner sidewall of the gate insulation pattern 120 and filling an upper portion of the second recess. The first barrier pattern 130, the first conductive pattern 140 and the second conductive pattern 150 may form a gate electrode.

The gate insulation pattern 120 may include an oxide, e.g., silicon oxide. The first barrier pattern 130 may include a metal nitride, e.g., titanium nitride, tantalum nitride, etc. The first conductive pattern 140 may include, for example, a metal, a metal nitride, a metal silicide, doped polysilicon, etc. The second conductive pattern 150 may include, for example, doped polysilicon, and the gate mask 160 may include a nitride, e.g., silicon nitride.

In an example embodiment of the present inventive concept, the gate structure 170 may extend in the first direction D1, and a plurality of gate structures 170 may be spaced apart from each other in the second direction D2.

Figure 3:
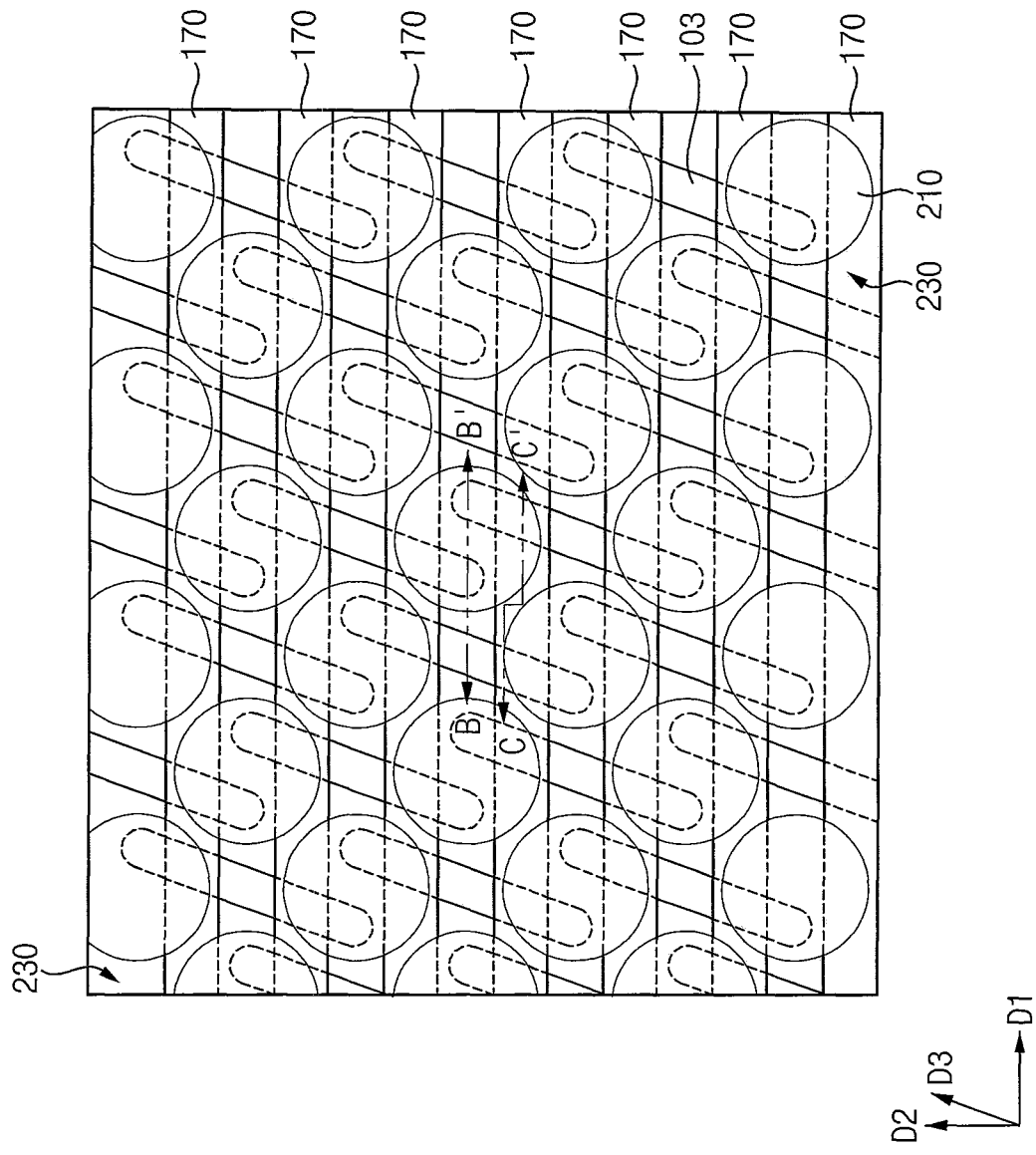
Figure 4:
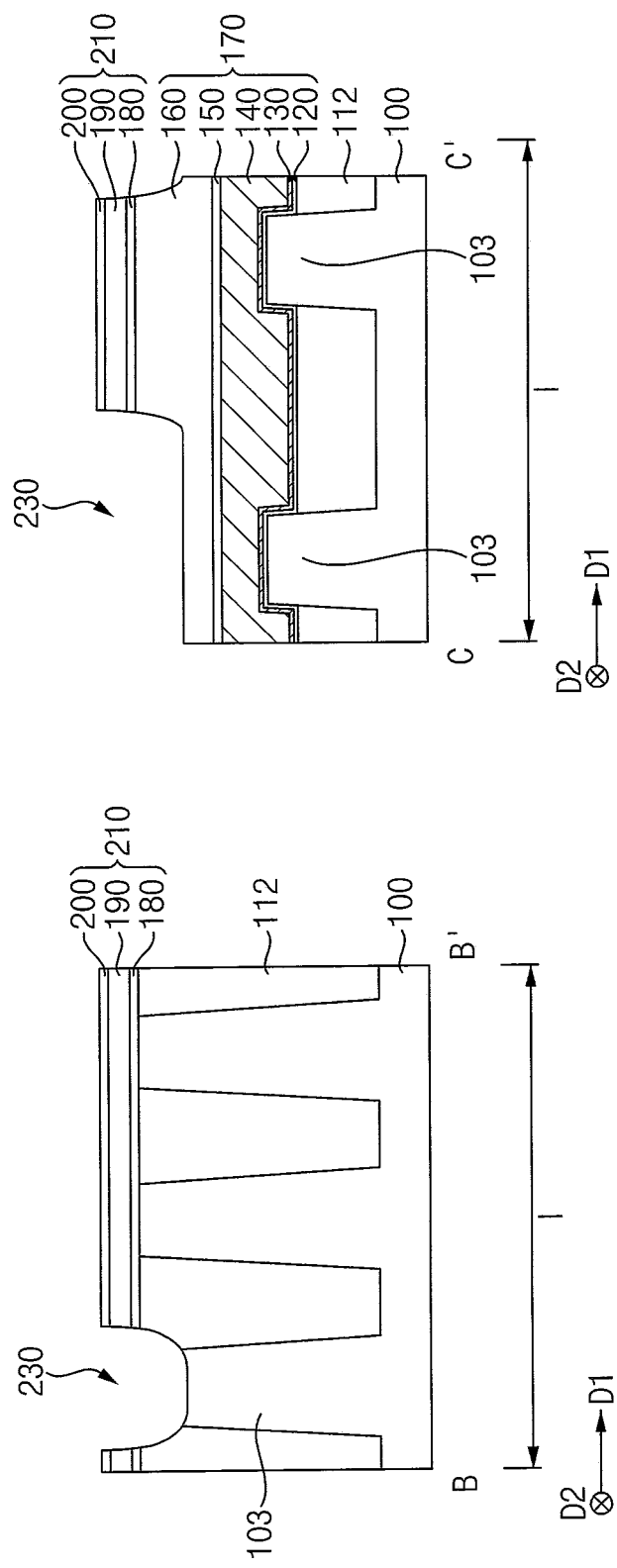

Referring to FIGS. 3 and 4, first and second insulation layers 180 and 190 may be formed on the substrate 100.

The first insulation layer 180 may include an oxide, e.g., silicon oxide, and the second insulation layer 190 may include a nitride, e.g., silicon nitride.

A natural oxide layer including, e.g., silicon oxide may be formed on the second insulation layer 190, which may be referred to as a third insulation layer 200. The first to third insulation layers 180, 190 and 200 may be referred to as an insulation layer structure 210.

The insulation layer structure 210 may be patterned, and the active pattern 103, the isolation pattern 112 and the gate mask 160 included in the gate structure 170 may be partially etched using the patterned insulation layer structure 210 as an etching mask to form a first opening 230. In an example embodiment of the present inventive concept, the insulation layer structure 210 remaining after the etching process may have a shape of a circle or an ellipse in a plan view, and a plurality of insulation layer structures 210 may be spaced apart from each other in the first and second directions D1 and D2. Each of the insulation layer structures 210 may overlap end portions in the third direction D3 of neighboring ones of the active patterns 103 in a vertical direction substantially perpendicular to an upper surface of the substrate 100.

Figure 5:
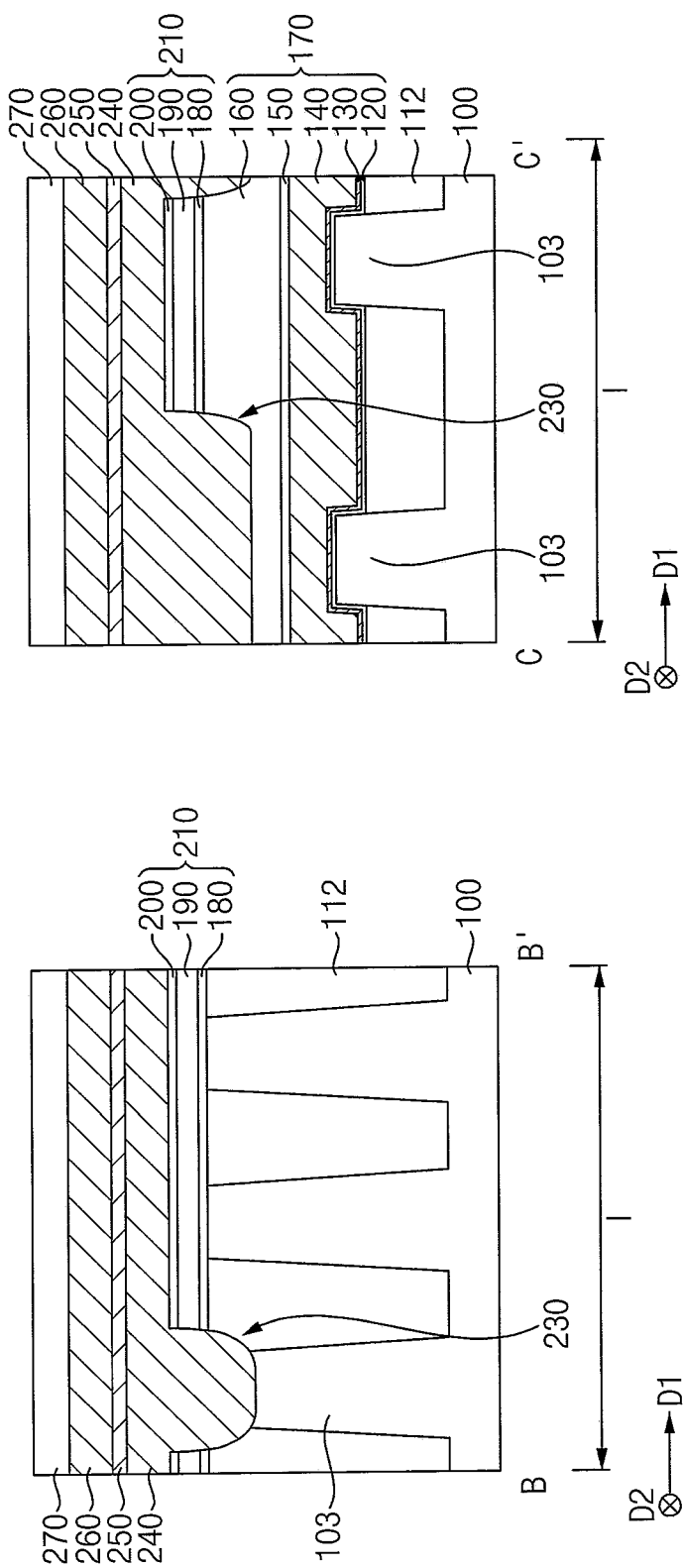

Referring to FIG. 5, a third conductive layer 240, a second barrier layer 250, a fourth conductive layer 260 and a first mask layer 270 may be sequentially stacked on the insulation layer structure 210 and the active pattern 103, the isolation pattern 112 and the gate structure 170, which are exposed by the first opening 230. The third conductive layer 240, the second barrier layer 250 and the fourth conductive layer 260 form a conductive layer structure. The third conductive layer 240 may fill the first opening 230.

The third conductive layer 240 may include, e.g., doped polysilicon. The second barrier layer 250 may include a metal silicon nitride, e.g., titanium silicon nitride. The fourth conductive layer 260 may include a metal, e.g., tungsten, and the first mask layer 270 may include a nitride, e.g., silicon nitride.

Figure 6:
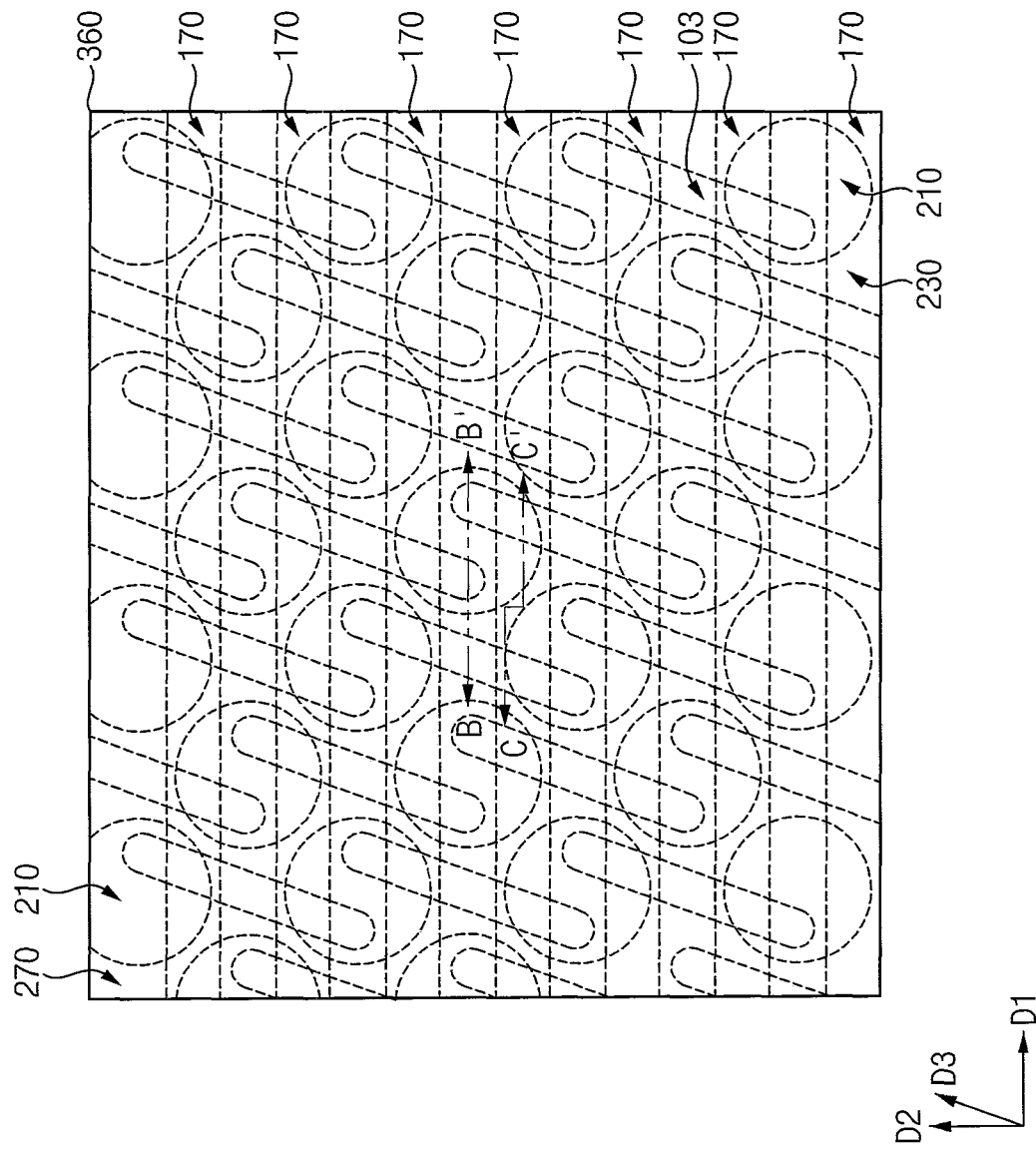
Figure 7:
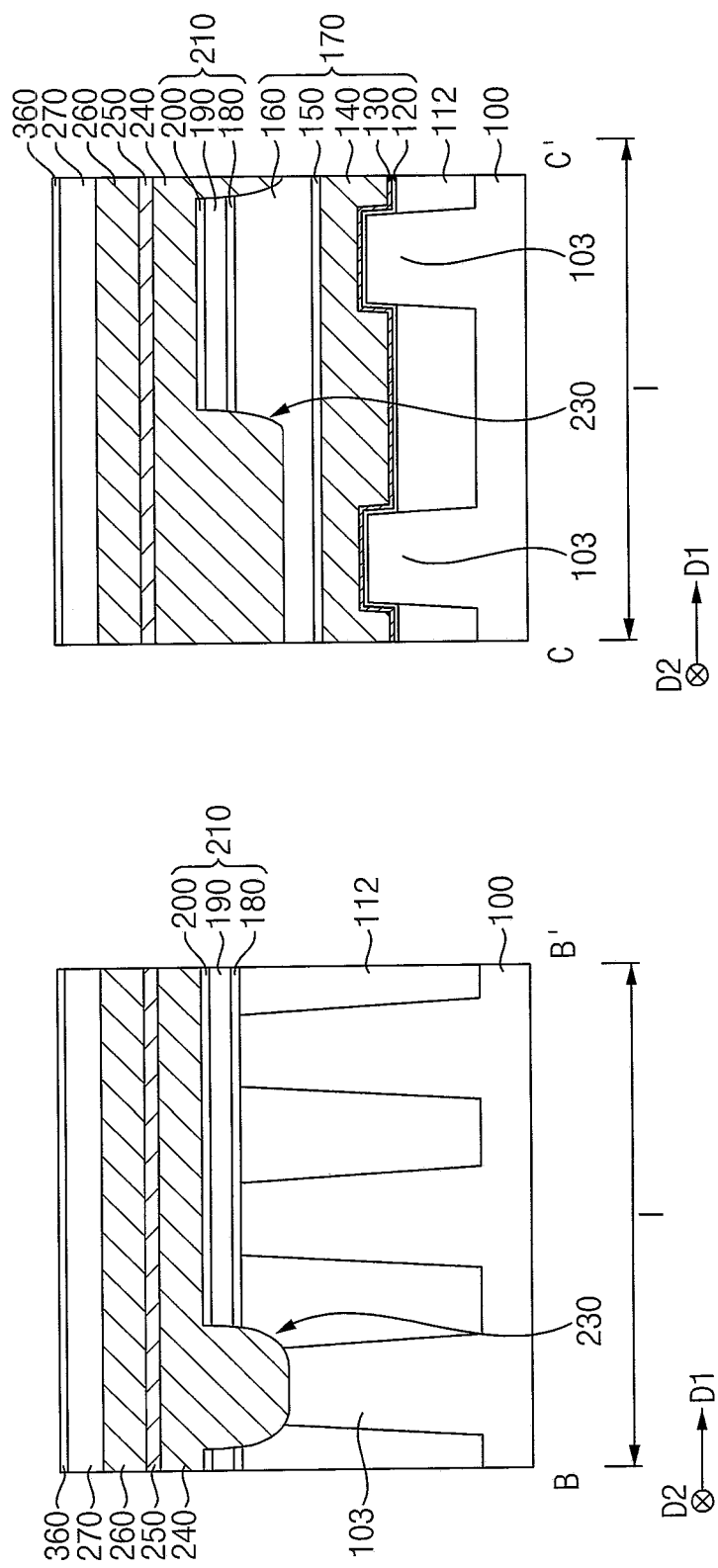

Referring to FIGS. 6 and 7, a first etch stop layer 360 may be formed on the first mask layer 270. The first etch stop layer 360 may include a nitride, e.g., silicon nitride.

Figure 8:
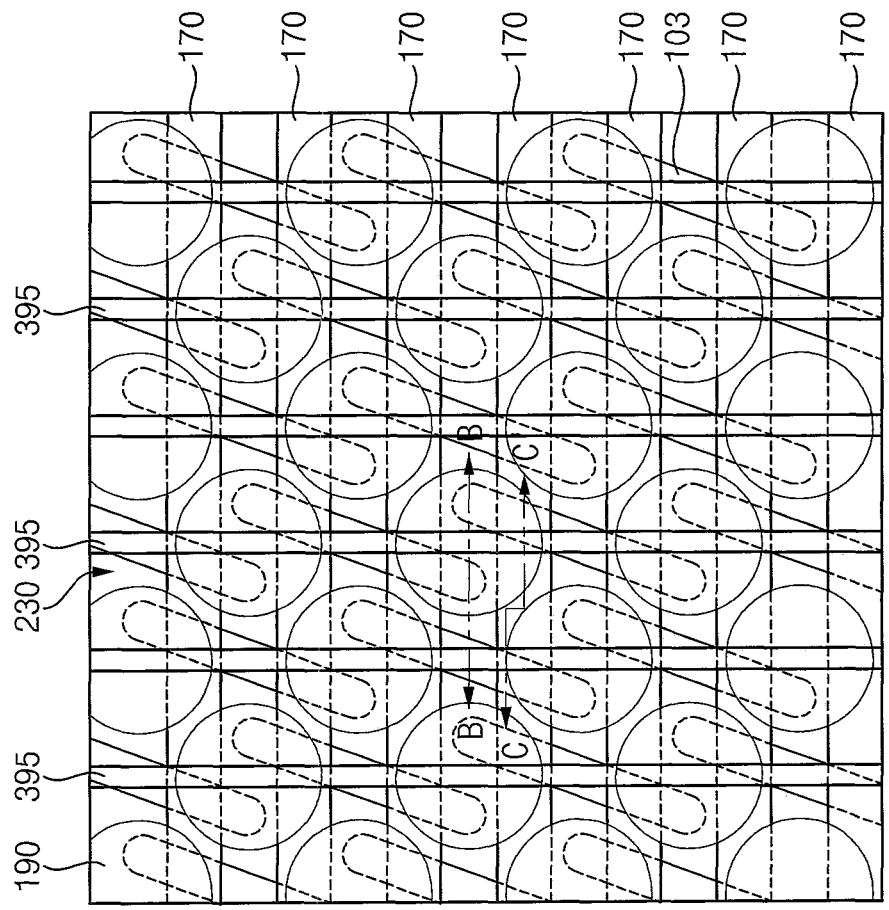
Figure 9:
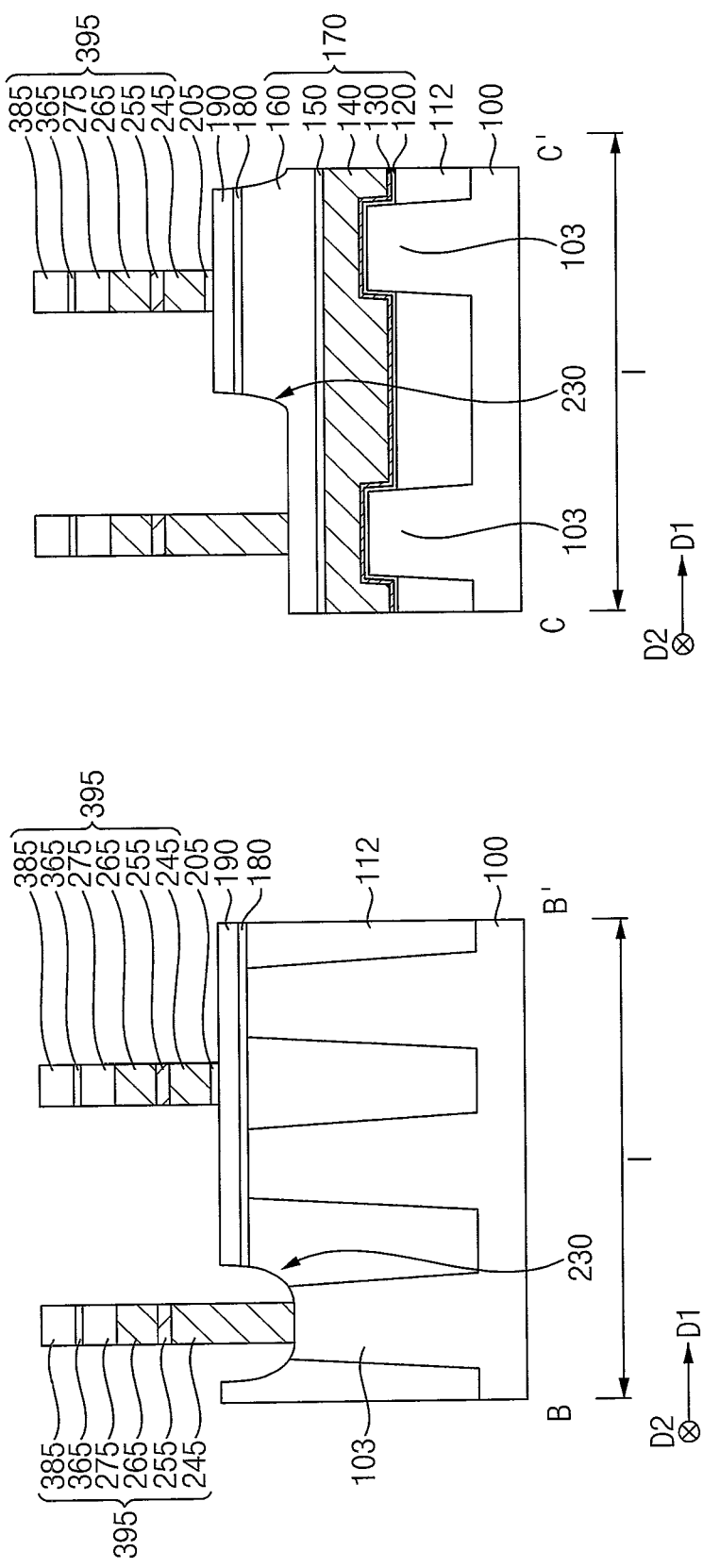

Referring to FIGS. 8 and 9, a first capping layer may be formed on the first etch stop layer 360, and may be patterned to form a first capping pattern 385.

In an example embodiment of the present inventive concept, the first capping pattern 385 may extend in the second direction D2, and a plurality of first capping patterns 385 may be spaced apart from each other in the first direction D1. The first capping pattern 385 may include a nitride, e.g., silicon nitride.

The first etch stop layer 360, the first mask layer 270, the fourth conductive layer 260, the second barrier layer 250 and the third conductive layer 240 may be sequentially etched using the first capping pattern 385 as an etching mask.

By the etching process, a third conductive pattern 245, a second barrier pattern 255, a fourth conductive pattern 265, a first mask 275, a first etch stop pattern 365 and the first capping pattern 385 may be sequentially stacked on the first opening 230, and outside of the first opening 230, a third insulation pattern 205, the third conductive pattern 245, the second barrier pattern 255, the fourth conductive pattern 265, the first mask 275, the first etch stop pattern 365 and the first capping pattern 385 may be sequentially stacked on the second insulation layer 190 of the insulation layer structure 210.

Hereinafter, the third conductive pattern 245, the second barrier pattern 255, the fourth conductive pattern 265, the first mask 275, the first etch stop pattern 365 and the first capping pattern 385 that are sequentially stacked may be referred to as a bit line structure 395. The bit line structure 395 may include a conductive structure including the third conductive pattern 245, the second barrier pattern 255 and the fourth conductive pattern 265 sequentially stacked on each other. In addition, the bit line structure 395 may include an insulation structure disposed on the conductive structure and including the first mask 275, the first etch stop pattern 365 and the first capping pattern 385 sequentially stacked on the conductive structure. In an example embodiment of the present inventive concept, the bit line structure 395 may extend in the second direction D2 on the substrate 100, and a plurality of bit line structures 395 may be spaced apart from each other in the first direction D1.

Figure 10:
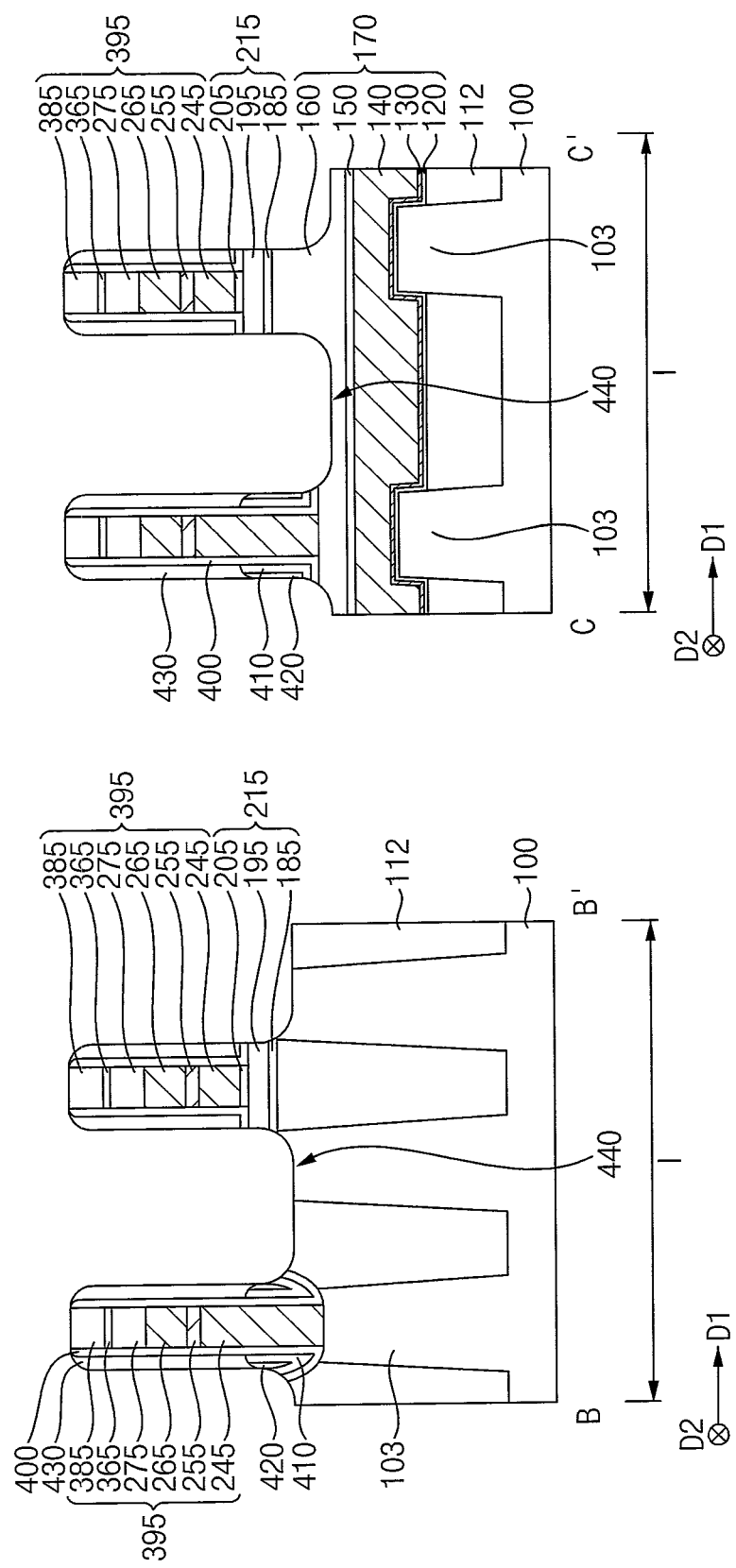

Referring to FIG. 10, a first spacer layer may be formed on the substrate 100 having the bit line structure 395 thereon, and fourth and fifth insulation layers may be sequentially formed on the first spacer layer.

The first spacer layer may also cover a sidewall of the third insulation pattern 205 that is disposed under a portion of the bit line structure 395 that is disposed on the second insulation layer 190, and the fifth insulation layer may fill a remaining portion of the first opening 230.

The first spacer layer may include a nitride, e.g., silicon nitride. The fourth insulation layer may include an oxide, e.g., silicon oxide, and the fifth insulation layer may include a nitride, e.g., silicon nitride.

The fourth and fifth insulation layers may be etched by an etching process. In an example embodiment of the present inventive concept, the etching process may be performed by a wet etching process using phosphoric acid, SCI and hydrofluoric acid as an etching solution, and other portions of the fourth and fifth insulation layers except for portions of the fourth and fifth insulation layers in the first opening 230 may be removed. Thus, most of a surface of the first spacer layer, that is, other portions of the first spacer layer except for the portion thereof in the first opening 230 may be exposed, and the portions of the fourth and fifth insulation layers remaining in the first opening 230 may form fourth and fifth insulation patterns 410 and 420, respectively.

A second spacer layer may be formed on the exposed surface of the first pacer layer and the fourth and fifth insulation patterns 410 and 420 in the first opening 230, and may be anisotropically etched to form a preliminary second spacer 430 on the surface of the first spacer layer and the fourth and fifth insulation patterns 410 and 420 to cover a sidewall of the bit line structure 395. The preliminary second spacer layer may include an oxide, e.g., silicon oxide.

A dry etching process may be performed using the first capping pattern 385 and the preliminary second spacer 430 as an etching mask to form a second opening 440 exposing an upper surface of the active pattern 103, and upper surfaces of the isolation pattern 112 and the gate mask 160 may also be exposed by the second opening 440.

By the dry etching process, a portion of the first spacer layer on the upper surfaces of the first capping pattern 385 and the second insulation layer 190 may be removed, and thus a first spacer 400 may be formed to cover the sidewall of the bit line structure 395. Additionally, during the dry etching process, the first and second insulation layers 190 and 200 may be partially removed, and first and second insulation patterns 195 and 205 may remain under the bit line structure 395. The first to third insulation patterns 195, 205 and 215, which are sequentially stacked on each other under the bit line structure 395, may form a first insulation pattern structure.

Figure 11:
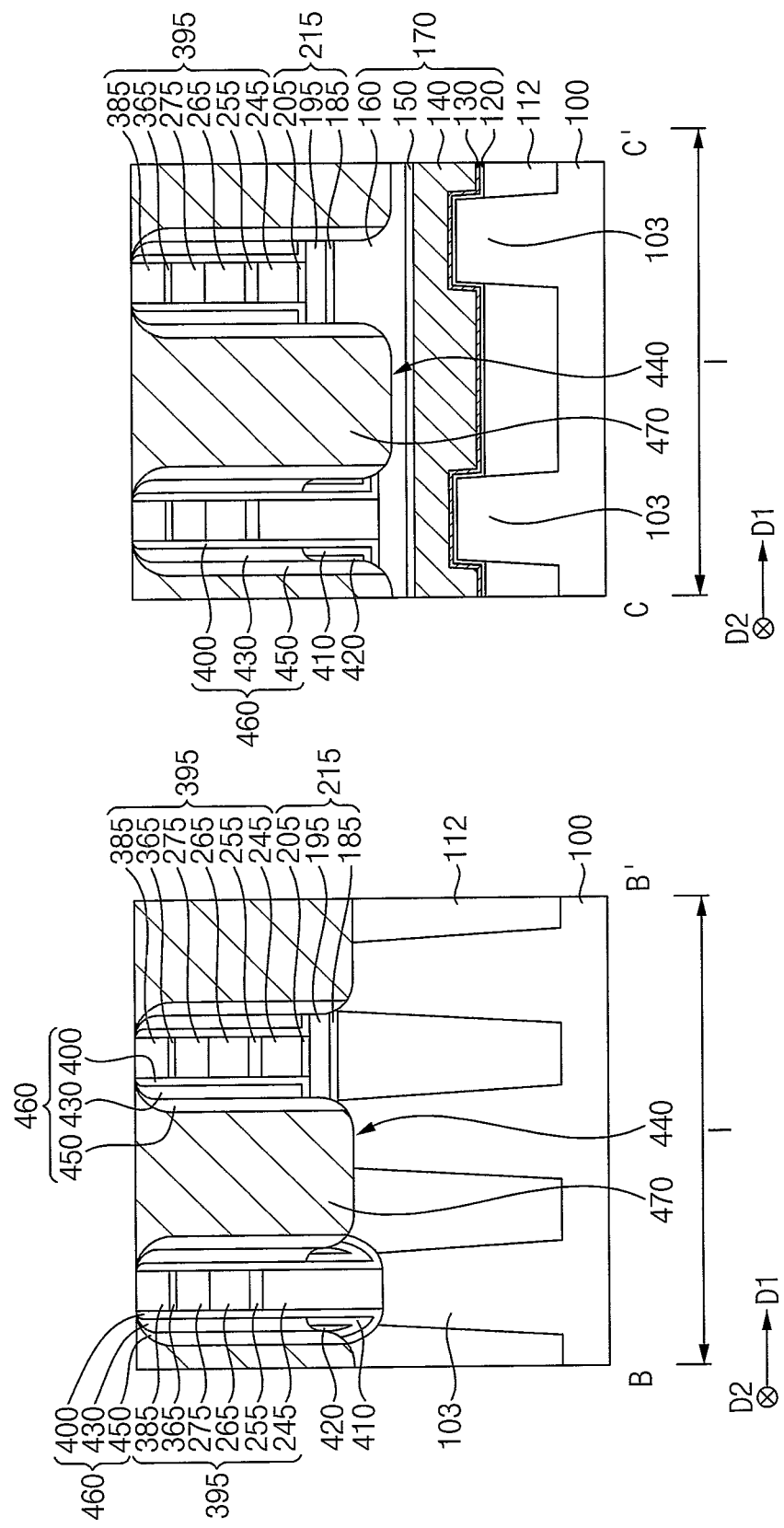

Referring to FIG. 11, a third spacer layer may be formed on the upper surface of the first capping pattern 385, an outer sidewall of the preliminary second spacer 430, portions of the upper surfaces of the fourth and fifth insulation patterns 410 and 420, and upper surfaces of the active pattern 103, which is exposed by the second opening 440, the isolation pattern 112, which is exposed by the second opening 440, and the gate mask 160 that is exposed by the second opening 440, and may be anisotropically etched to form a third spacer 450 covering the sidewall of the bit line structure 395. The third spacer layer may include a nitride, e.g., silicon nitride.

The first spacer 400, the preliminary second spacer 430 and the third spacer 450, which are sequentially stacked on the sidewall of the bit line structure 395 in a horizontal direction substantially parallel to the upper surface of the substrate 100, may be referred to as a preliminary spacer structure 460.

A lower contact plug layer 470 may be formed to fill the second opening 440, and may be planarized until the upper surface of the first capping pattern 385 is exposed. For example, an upper surface of the lower contact plug layer 470 may be coplanar with the upper surface of the first capping pattern 385.

In an example embodiment of the present inventive concept, the lower contact plug layer 470 may extend in the second direction D2, and a plurality of lower contact plug layers 470 may be spaced apart from each other in the first direction D1 by the bit line structures 395. The lower contact plug layer 470 may include, e.g., doped polysilicon.

Figure 12:
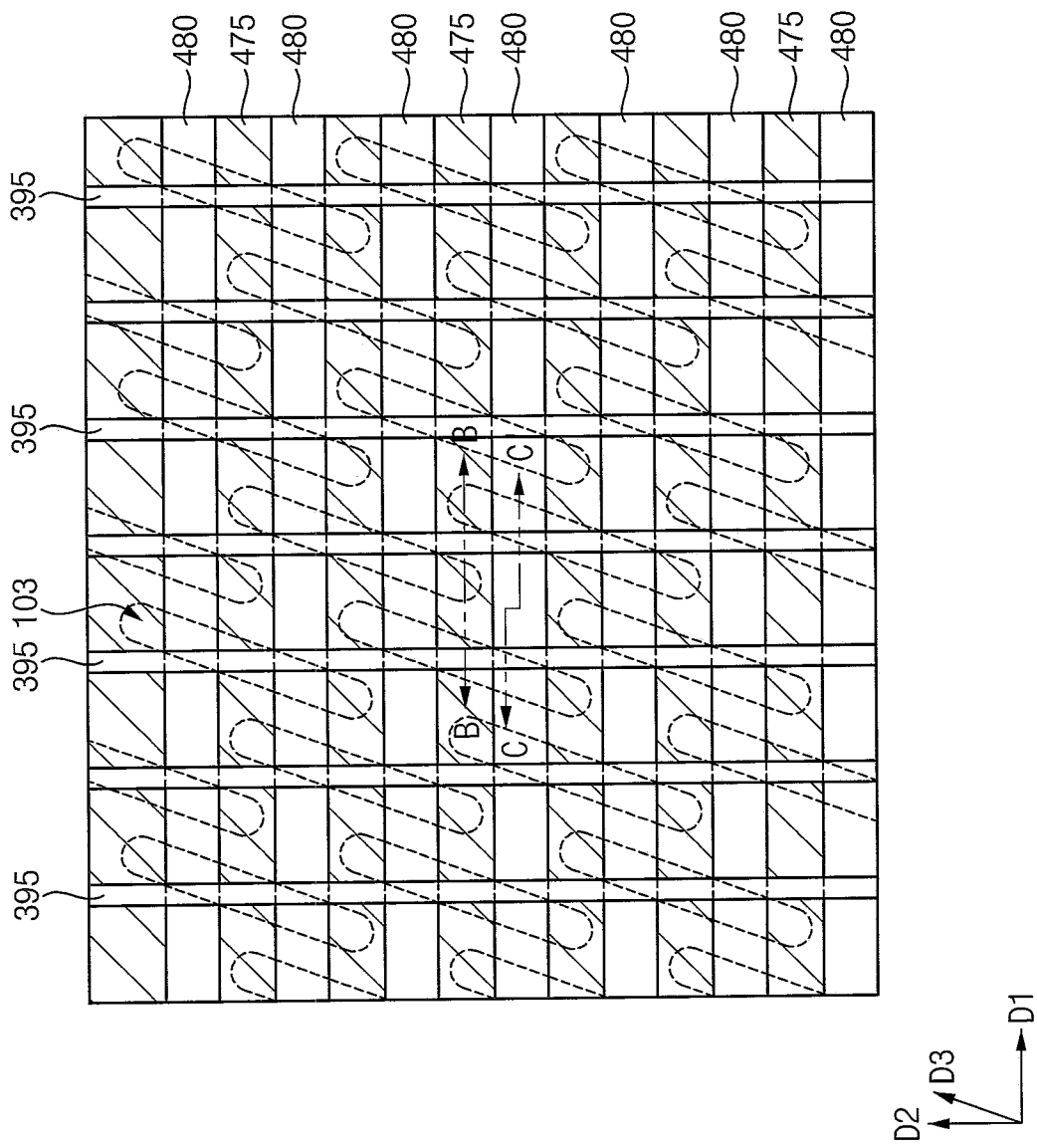
Figure 13:
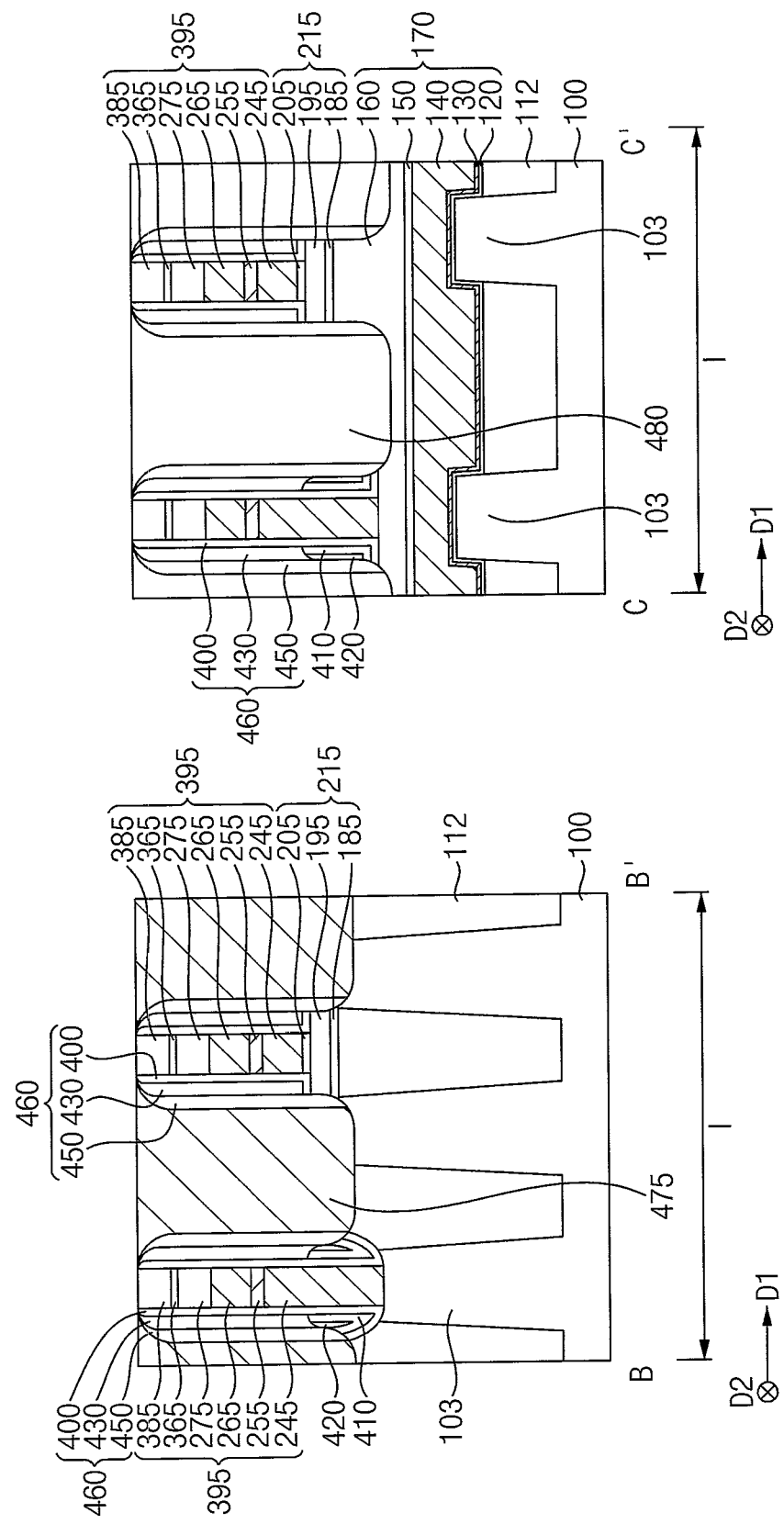

Referring to FIGS. 12 and 13, a second mask having a plurality of third openings spaced apart from each other in the second direction D2, each of which may extend in the first direction D1, may be formed on the first capping pattern 385 and the lower contact plug layer 470, and the lower contact plug layer 470 may be etched using the second mask as an etching mask.

In an exemplary embodiment of the present inventive concept, each of the third openings may overlap the gate structure 170 in the vertical direction. By the etching process, a fourth opening exposing an upper surface of the gate mask 160 of the first gate structure 170 may be formed between the bit line structures 395.

After removing the second mask, a second capping pattern 480 may be formed to fill the fourth opening. The second capping pattern 480 may include a nitride, e.g., silicon nitride. In an example embodiment of the present inventive concept, a plurality of second capping patterns 480 may be spaced apart from each other in the second direction D2 between the bit line structures 395 neighboring in the first direction D1. For example, the second capping patterns 480 may extend in the first direction D1 while the bit line structures 395 extend in the second direction D2.

Thus, the lower contact plug layer 470 may be divided into a plurality of lower contact plugs 475 spaced apart from each other in the second direction D2 by the second capping patterns 480.

Figure 14:
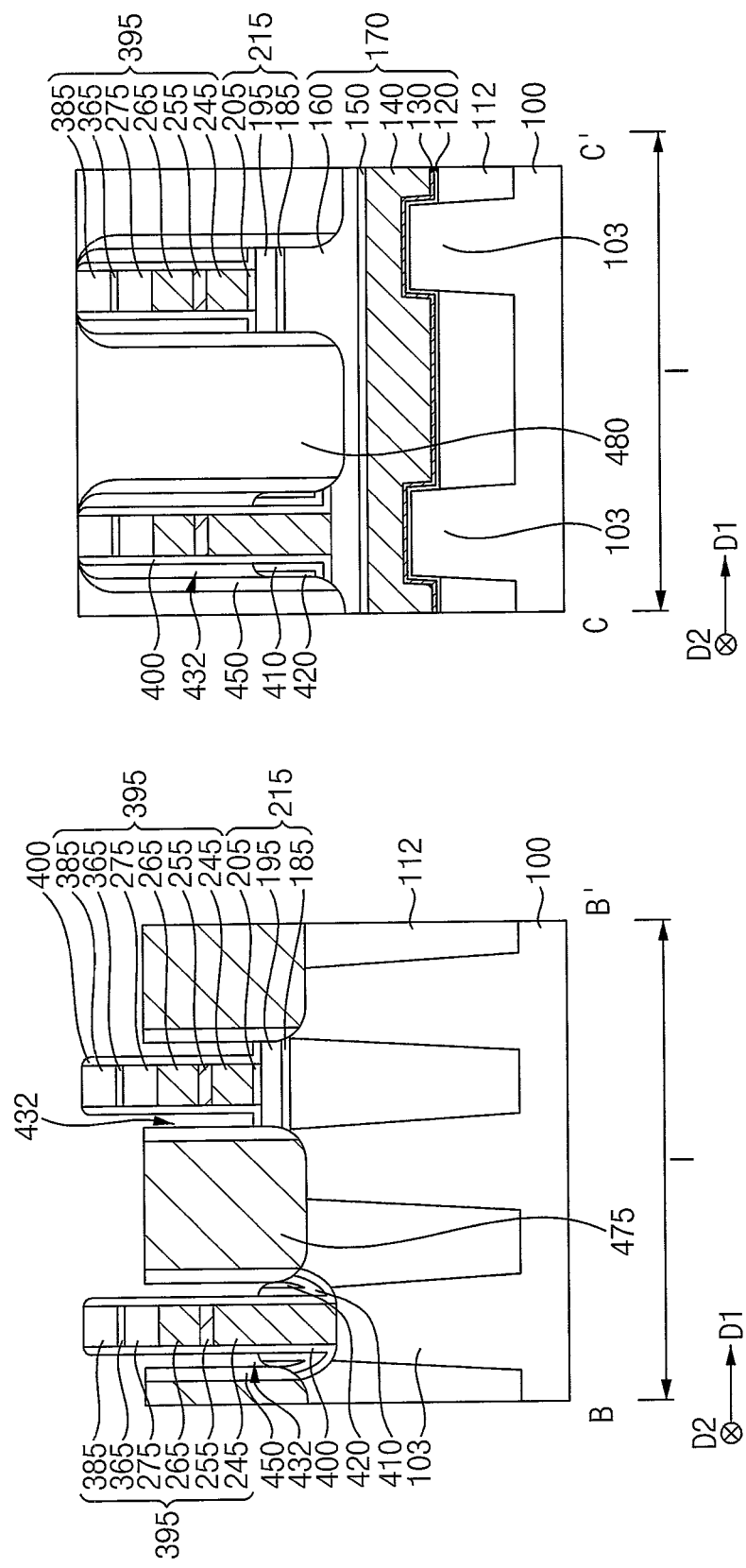

Referring to FIG. 14, an upper portion of the lower contact plug 475 may be removed to expose an upper portion of the preliminary spacer structure 460 on the sidewall of the bit line structure 395, and upper portions of the preliminary second spacer 430 and the third spacer 450 of the exposed preliminary spacer structure 460 may be removed.

An upper portion of the lower contact plug 475 may be removed by, e.g., an etch back process, and the upper portions of the preliminary second spacer 430 and the third spacer 450 may be removed by, e.g., a wet etching process.

The preliminary second spacer 430 may be further removed to form an air gap 432. The preliminary second spacer 430 may be removed by, e.g., a dry etching process. The air gap 432 may be formed between the lower contact plug 475 and the bit line structure 395.

In an example embodiment of the present inventive concept, not only a portion of the preliminary second spacer 430 under the lower contact plug 475 but also a portion of the preliminary second spacer 430 covered by the second capping pattern 480 may be removed.

As the air gap 432 is formed, an upper portion of the first spacer 400 and upper surfaces of the fourth and fifth insulation patterns 410 and 420 may be exposed.

Figure 15:
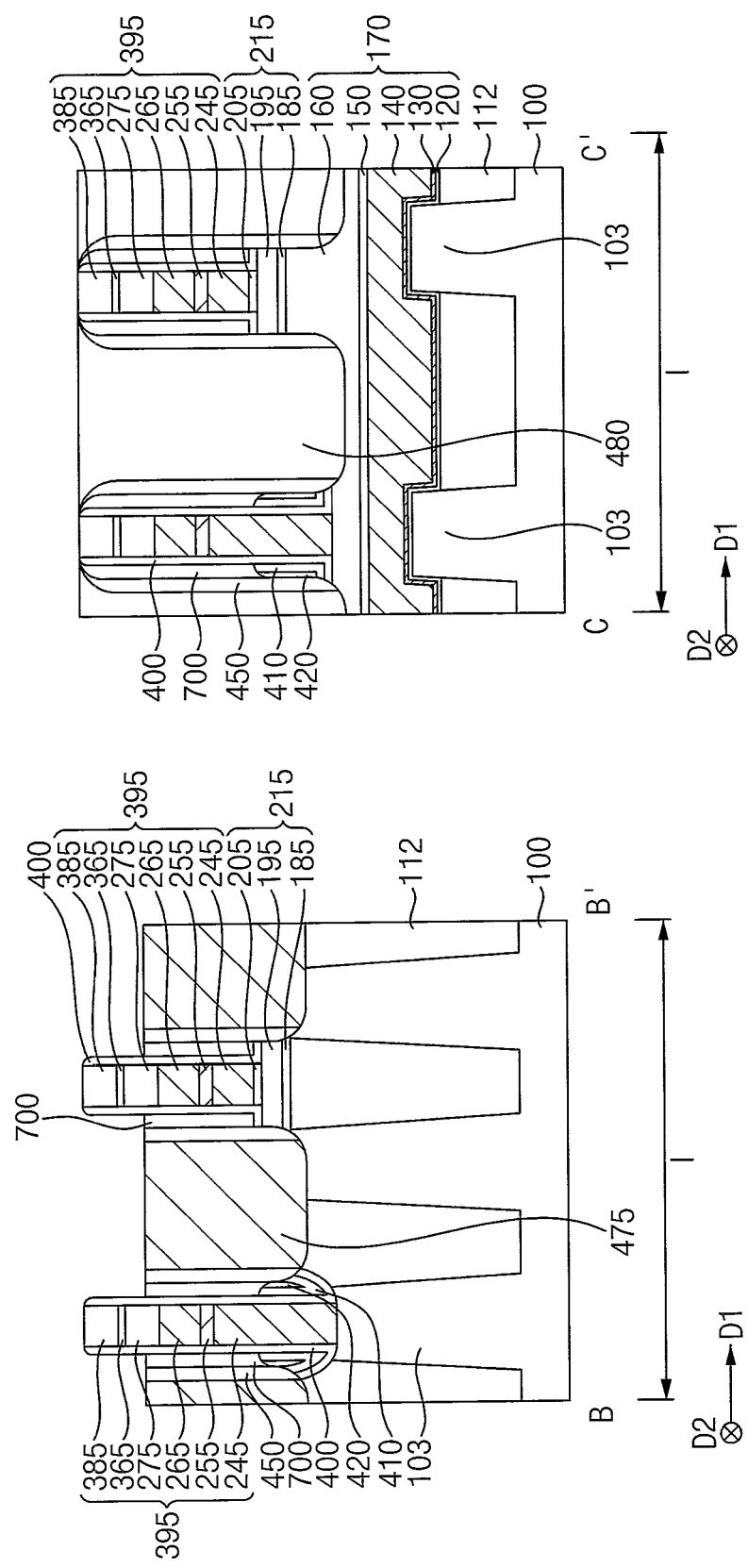

Referring to FIG. 15, a first sacrificial pattern 700 may be formed to fill the air gap 432.

The first sacrificial pattern 700 may be formed by forming a first sacrificial layer on the bit line structure 395, the first and third spacers 400 and 450, the lower contact plug 475 and the second capping pattern 480, and performing an etch back process on the first sacrificial layer until an upper surface of the lower contact plug 475 is exposed. A stripping process may be performed.

Thus, an upper surface of the first sacrificial pattern 700 may be substantially coplanar with upper surfaces of the lower contact plug 475 and the third spacer 450.

In an example embodiment of the present inventive concept the first sacrificial pattern 700 may include a pyrolysis material that may be decomposed by heat.

Figure 16:
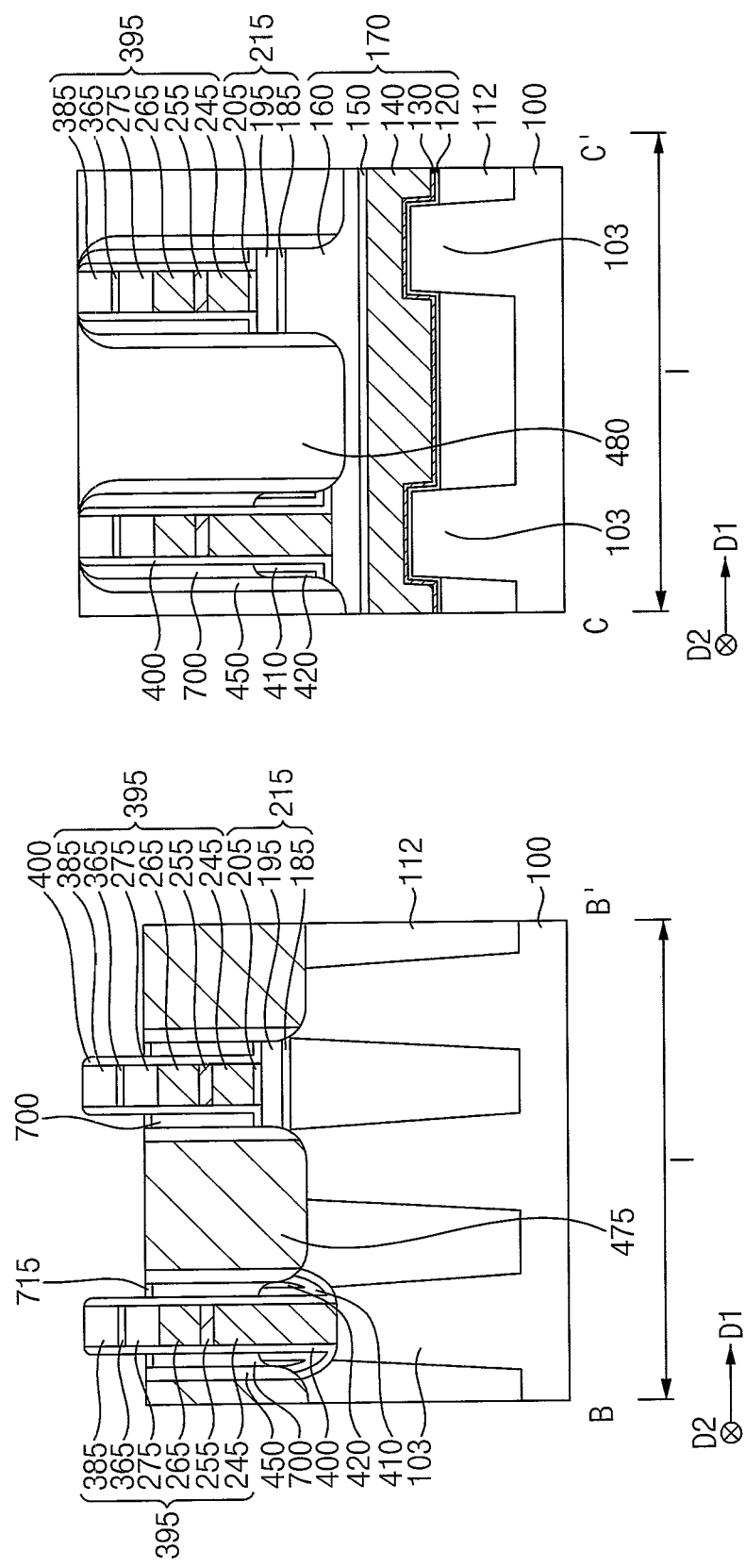

Referring to FIG. 16, an upper portion of the first sacrificial pattern 700 may be removed to form a third recess, and a third capping pattern 715 may be formed in the third recess.

In an example an embodiment of the present inventive concept, a third capping layer 710 (refer to FIG. 24) may be formed on the bit line structure 395, the first and third spacers 400 and 450, the first sacrificial pattern 700, the lower contact plug 475 and the second capping pattern 480 by, e.g., an ALD process to fill the third recess, and a wet etching process may be performed on the third capping layer so that the third capping pattern 715 may be formed in the third recess. Thus, an upper surface of the third capping pattern 715 may be substantially coplanar with the upper surfaces of the lower contact plug 475 and the third spacer 450.

In an example an embodiment of the present inventive concept, the third capping pattern 715 may include an oxide, e.g., silicon oxide.

Figure 17:
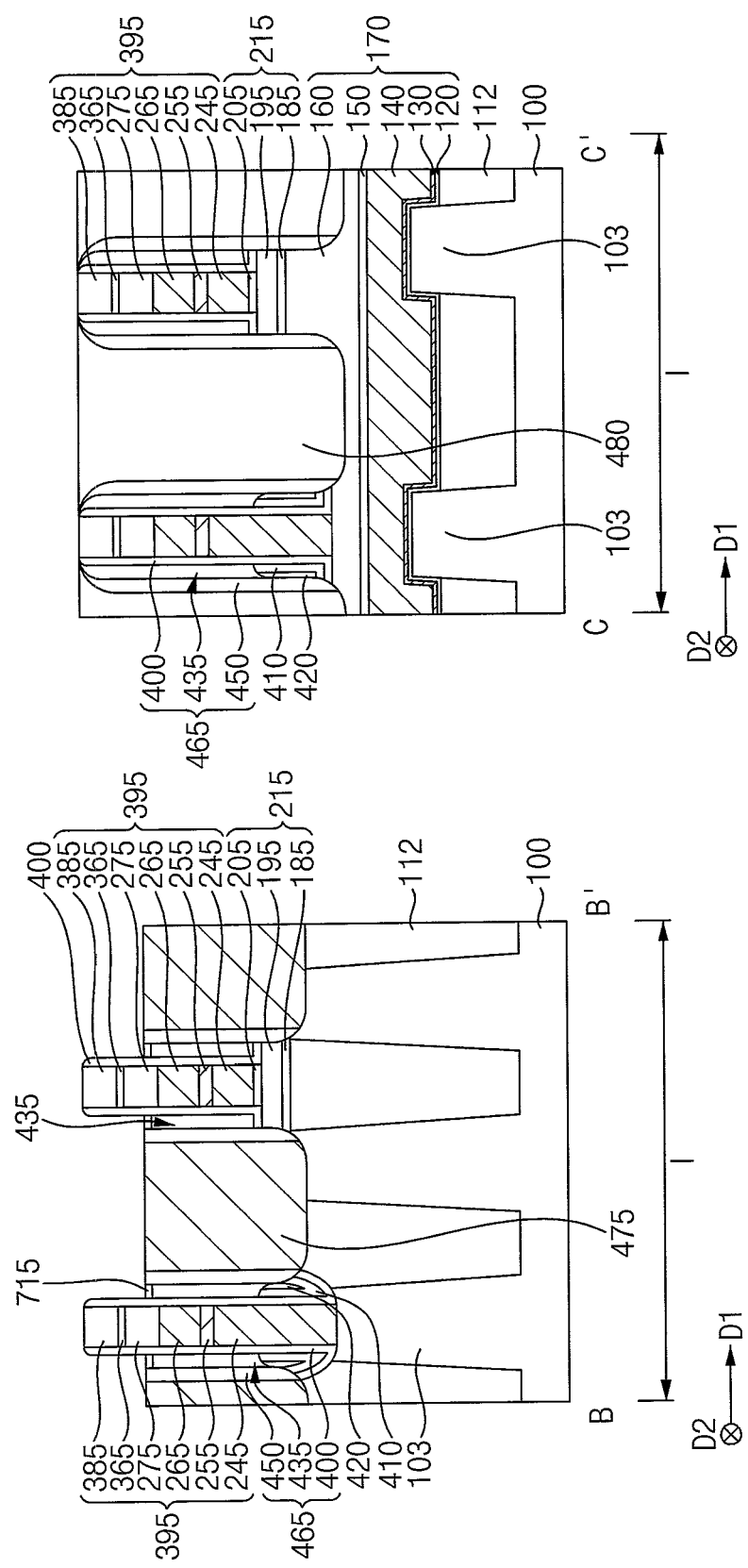

Referring to FIG. 17, the substrate 100 may be heated to remove the first sacrificial pattern 700.

In an example embodiment of the present inventive concept, the substrate 100 having the first sacrificial pattern 700 thereon may be heated to a temperature of more than about 150° C., and the first sacrificial pattern 700 including the pyrolysis material may be removed.

Thus, a second spacer 435 including air may be formed between the first and third spacers 400 and 450, and may be referred to as an air spacer 435.

The first to third spacers 400, 435 and 450 sequentially stacked on the sidewall of the bit line structure 395 in the horizontal direction may form a spacer structure 465.

Figure 18:
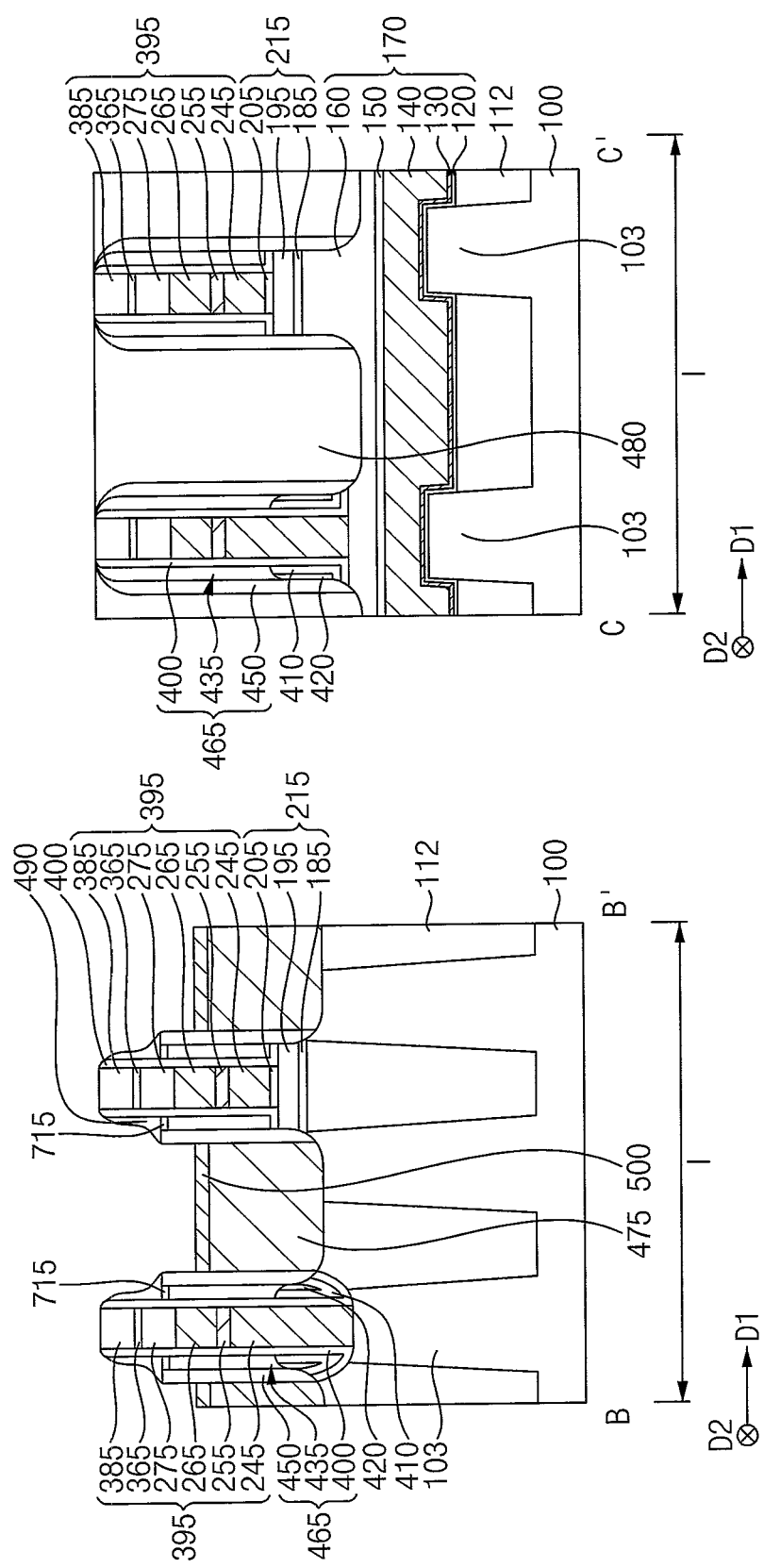

Referring to FIG. 18, a fourth spacer layer may be formed on the bit line structure 395, the spacer structure 465, the third capping pattern 715, the lower contact plug 475 and the second capping pattern 480, and may be, for example, anisotropically etched to form a fourth spacer 490 on a sidewall of a portion of the first spacer 400 on an upper sidewall of the bit line structure 395.

The fourth spacer 490 formed by the anisotropic etching process may cover an upper surface of the third capping pattern 715 and at least a portion of an upper surface of the third spacer 450. Thus, an upper portion of the lower contact plug 475 may be partially removed during the anisotropic etching process, and a portion of the third spacer 450 not covered by the fourth spacer 490 may be partially removed.

A fifth spacer layer may be formed on the bit line structure 395, the first spacer 400, the fourth spacer 490, the lower contact plug 475 and the second capping pattern 480, and may be etched to form a fifth spacer on a sidewall of the fourth spacer 490. An etching process may be performed using the bit line structure 395, the first spacer 400, the fourth spacer 490, and the second capping pattern 480 as an etching mask so that an upper portion of the lower contact plug 475 may be further removed. Thus, an upper surface of the lower contact plug 475 may be lower than upper surfaces of the second and third spacers 435 and 450.

A metal silicide pattern 500 may be formed on the lower contact plug 475. For example, the metal silicide pattern 500 may be formed on the upper surface of lower contact plug 475. In an example embodiment of the present inventive concept, the metal silicide pattern 500 may be formed by forming a first metal layer on the bit line structure 395, the first and fourth spacers 400 and 490, the lower contact plug 475 and the second capping pattern 480, performing a heat treatment on the first metal layer to perform a silicidation process, and removing an unreacted portion of the first metal layer. In the silicidation process, the first metal layer, which includes a metal, and the lower contact plug 475, which includes silicon, may react with each other. A height of an upper surface of the metal silicide pattern 500 that may be formed by the silicidation process may slightly increase.

The metal silicide pattern 500 may include, e.g., cobalt silicide, nickel silicide, titanium silicide, etc.

Figure 19:
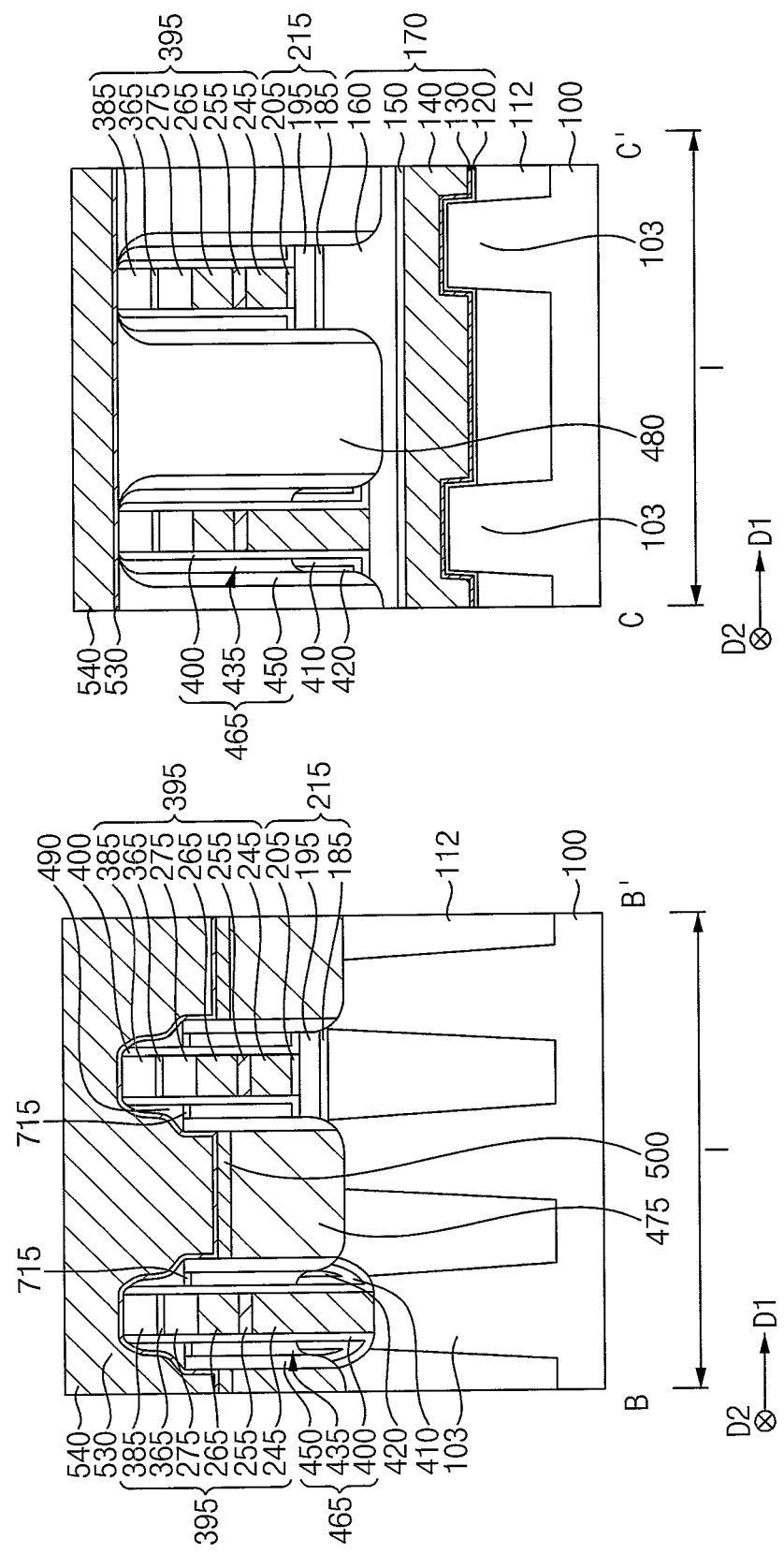

Referring to FIG. 19, a third barrier layer 530 may be formed on the bit line structure 395, the first and fourth spacers 400 and 490, the metal silicide pattern 500 and the second capping pattern 480, and a second metal layer 540 may be formed on the third barrier layer 530 to fill a space between the bit line structures 395.

A planarization process may be performed on an upper portion of the second metal layer 540. The planarization process may include, for example, a CMP process and/or an etch back process.

Figure 20:
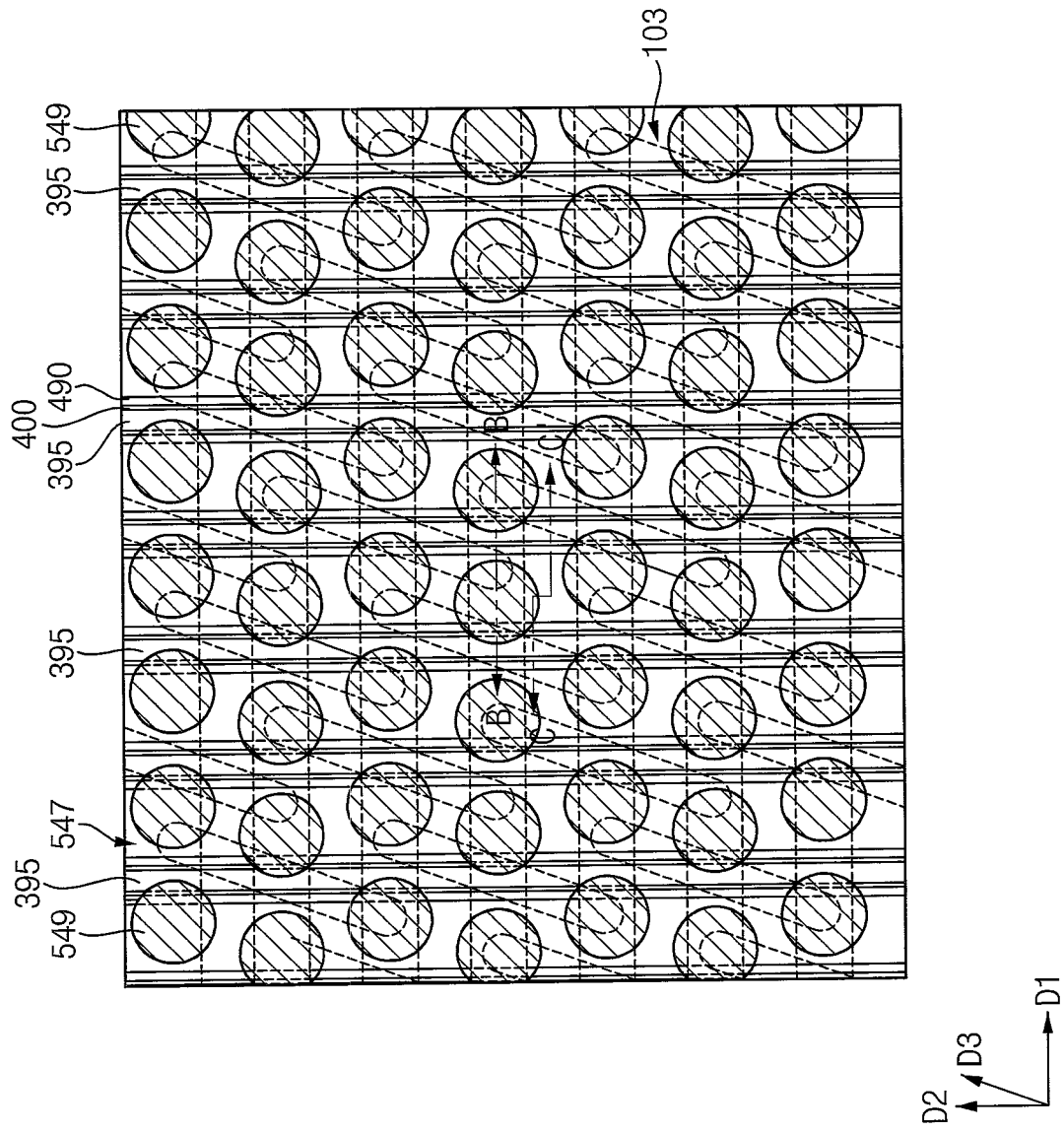
Figure 21:
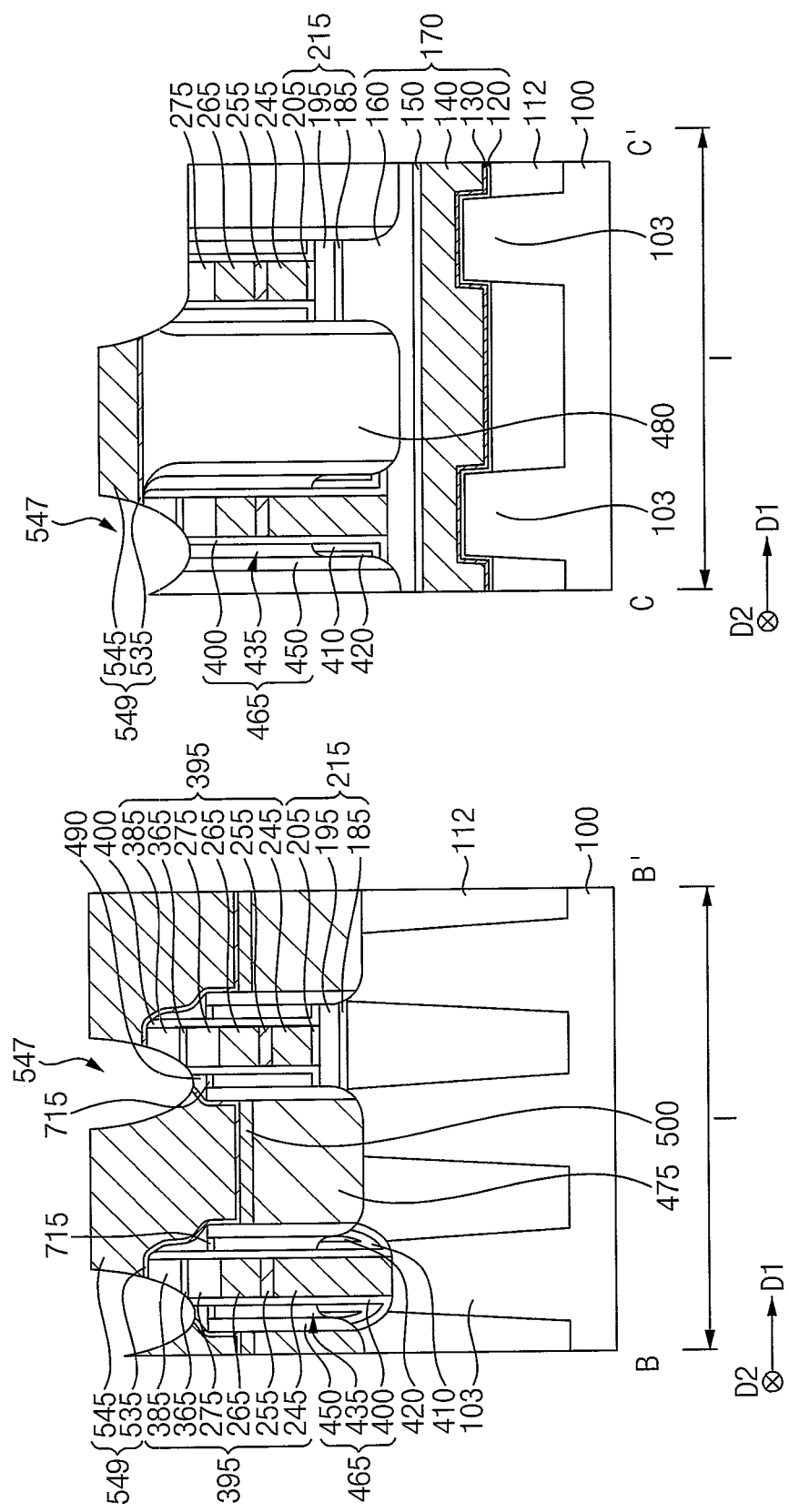

Referring to FIGS. 20 and 21, the second metal layer 540 and the third barrier layer 530 may be patterned to form an upper contact plug 549, and a fifth opening 547 may be formed between the upper contact plugs 549.

During the formation of the fifth opening 547, the first and second capping patterns 385 and 480, the third spacer structure 465, the fourth spacer 490 and the first mask 275 may be partially removed in addition to the second metal layer 540 and the third barrier layer 530.

As the fifth opening 547 is formed, the second metal layer 540 and the third barrier layer 530 may be transformed into a second metal pattern 545 and a third barrier pattern 535, respectively, which may form an upper contact plug 549. For example, the third barrier pattern 535 may cover a lower surface and a sidewall of the second metal pattern 545. In an example embodiment of the present inventive concept, a plurality of upper contact plugs 549 may be spaced apart from each other in the first and second directions D1 and D2, and may be arranged in a honeycomb pattern in a plan view. For example, adjacent rows of upper contact plugs 549 may be misaligned with each other. For example, each of the upper contact plugs 103 may overlap an end of an active pattern 103. Each of the upper contact plugs 549 may have a shape of, for example, a circle, an ellipse, or a polygon.

The lower contact plug 475, the metal silicide pattern 500 and the upper contact plug 549 sequentially stacked on the substrate 100 may form a contact plug structure.

Figure 22:
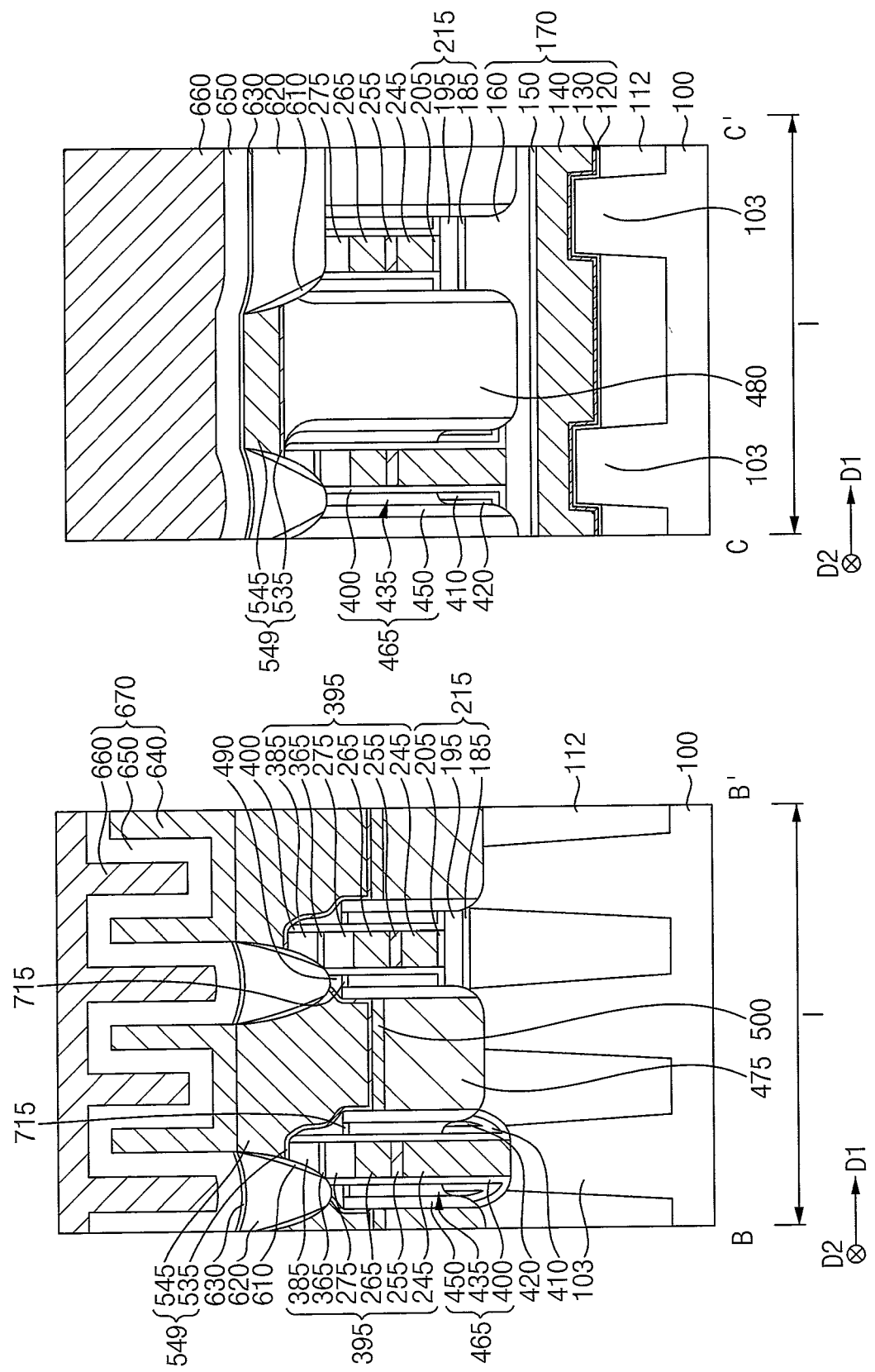

Referring to FIG. 22, a sixth insulation pattern 610 may be formed on at least a sidewall of the fifth opening 547, and a seventh insulation pattern 620 may be formed to fill a remaining portion of the fifth opening 547.

The sixth insulation pattern 610 may be formed by forming a sixth insulation layer on at least an inner wall of the fifth opening 547, the upper contact plug 549 and the second capping pattern 480, and anisotropically etching the sixth insulation layer.

The seventh insulation pattern 620 may be formed by forming a seventh insulation layer on the sixth insulation pattern 610, the upper contact plug 549 and the second capping pattern 480, and performing an etch back process on the seventh insulation layer.

Each of the sixth and seventh insulation patterns 610 and 620 may include a nitride, e.g., silicon nitride, and the sixth and seventh insulation patterns 610 and 620 may form a second insulation pattern structure.

A second etch stop layer 630 may be formed on the seventh insulation pattern 620, the upper contact plug 549 and the second capping pattern 480, and a mold layer may be formed on the second etch stop layer 630. A portion of the mold layer and a portion of the second etch stop layer 630 thereunder may be partially etched to form a sixth opening exposing an upper surface of the upper contact plug 549.

As the plurality of upper contact plugs 549 is spaced apart from each other in the first and second directions D1 and D2, and may be arranged in a honeycomb pattern or a lattice pattern in a plan view, the sixth openings exposing the upper contact plugs 549 may be arranged with an arrangement corresponding to that of the upper contact plugs 549. For example, the sixth openings may also be arranged in a honeycomb pattern or a lattice pattern in a plan view.

A lower electrode layer may be formed on a sidewall of the sixth opening, the exposed upper surface of the upper contact plug 549 and the mold layer. A second sacrificial layer may be formed on the lower electrode layer to fill the sixth opening, and the lower electrode layer and the second sacrificial layer may be planarized until an upper surface of the mold layer is exposed to divide the lower electrode layer.

Thus, a lower electrode 640 having a shape of, for example, a cylinder may be formed in the sixth opening. However, if the sixth opening has a small width, the lower electrode 640 may have a shape of, for example, a pillar. The lower electrode 640 may include, e.g., a metal, a metal nitride, a metal silicide, doped polysilicon, etc.

The second sacrificial layer and the mold layer may be removed by, e.g., a wet etching process using, e.g., LAL solution.

A dielectric layer 650 may be formed on a surface of the lower electrode 640 and the second etch stop layer 630. The dielectric layer 650 may include, e.g., a metal oxide.

An upper electrode 660 may be formed on the dielectric layer 650. The upper electrode 660 may include, e.g., a metal, a metal nitride, a metal silicide, doped silicon-germanium, etc. In an example embodiment of the present inventive concept, the upper electrode 660 may have a first upper electrode, which includes a metal or a metal nitride and a second upper electrode, which includes doped silicon-germanium.

The lower electrode 640, the dielectric layer 650 and the upper electrode 660 may form a capacitor 670.

Upper wirings may be further formed on the capacitor 670 to complete the fabrication of the semiconductor device.

As illustrated above, upper portions of the lower contact plug 475 on the sidewall of the bit line structure 395, the preliminary second spacer 430 of the preliminary spacer structure 460, and the third spacer 450 of the preliminary spacer structure 460 may be removed. The preliminary second spacer 430 may be removed to form an air gap 432, and the first sacrificial pattern 700 including a pyrolysis material may be formed in the air gap 432. The third capping pattern 715 may be formed to cover an upper surface of the first sacrificial pattern 700, and the substrate 100 may be heated to remove the first sacrificial pattern 700, so that the air spacer 435 including air may be formed.

The fourth spacer 490 may be formed to cover the upper surfaces of the third capping pattern 715 and the third spacer 450, and the metal silicide pattern 500 may be formed on the lower contact plug 475. The upper contact plug layer may be formed on the bit line structure 395, the fourth spacer 490 and the metal silicide pattern 500, and may be patterned to form the upper contact plug 549, and the second insulation pattern structure including the sixth and seventh insulation patterns 610 and 620 may be formed in the fifth opening 547 that may be formed during the patterning the upper contact plug layer.

Thus, the air spacer 435 may be formed by heating the first sacrificial pattern 700, which includes a pyrolysis material, with a top end of the air gap 432, which may be formed by the first and third spacers 400 and 450, that is closed by the third capping pattern 715, and thus, the air gap 432 might not be filled with other materials so that the air spacer 435 may have the initial volume of the air gap 432.

For example, if the upper contact plug layer is patterned to form the fifth opening 547 exposing the preliminary spacer structure 460, if the preliminary second spacer 430 exposed by the fifth opening 547 is removed to form an air gap, and if the fifth opening 547 is filled with the second insulation pattern structure so that the air gap is transformed into the air spacer 435, then the second insulation pattern structure may partially permeate into the air gap, so that the air spacer 435 might not have the initial volume of the air gap.

Additionally, the air spacer 435 might not be formed by exposing the preliminary second spacer 430 through the fifth opening 547 and removing the preliminary second spacer 430, but may be formed before forming the fifth opening 547. Thus, the fifth opening 547 might not be formed to a deep depth. If the fifth opening 547 is formed to a deep depth, for example, the metal silicide pattern 500 may be exposed so that a metal included in the metal silicide pattern 500 may partially leak. Thus, in an example embodiment of the present inventive concept, the leakage of the metal included in the metal silicide pattern 500 may be prevented.

As a result, the semiconductor device may include the air spacer 435 having a sufficient volume, so that the parasitic capacitance between neighboring conductive structures, e.g., between the bit line structure 395 and the contact plug structure may decrease, and the contact plug structure including the metal silicide pattern 500 may have enhanced electrical characteristics.

The semiconductor device manufactured by the above processes may have following structural characteristics.

Referring to FIGS. 20 and 22, the semiconductor device may include the active pattern 103, the first gate structure 170, the bit line structure 395, the spacer structure 465, the third capping pattern 715, the fourth spacer 490, the contact plug structure, and the capacitor 670. The active pattern 103 may extend in the third direction D3 on the substrate 100. The first gate structure 170 may extend in the first direction D1 in an upper portion of the active pattern 103. The bit line structure 395 may contact a central upper surface of the active pattern 103 and may extend in the second direction D2. The spacer structure 465 may include the first to third spacers 400, 435 and 450 sequentially stacked in the first direction D1 on the sidewall of the bit line structure 395. The third capping pattern 715 may be disposed on the second spacer 435. The fourth spacer 490 may be disposed on the third capping pattern 715 and the third spacer 450 and may contact the outer sidewall of the first spacer 400. The contact plug structure may contact each of opposite ends of the active pattern 103, and the capacitor 670 may be disposed on the contact plug structure.

In an example embodiment of the present inventive concept, the second spacer 435 may be an air spacer, and an upper surface of a portion of the third spacer 450 adjacent to the third capping pattern 715 may be substantially coplanar with an upper surface of the third capping pattern 715.

In an example embodiment of the preset inventive concept, the bit line structure 395 may include the conductive structure and the insulation structure sequentially stacked in the vertical direction. The conductive structure may include the third conductive pattern 245, the second barrier pattern 255 and the fourth conductive pattern 265 sequentially stacked on each other, and the insulation structure may include the first mask 275, the first etch stop pattern 365 and the first capping pattern 385 sequentially stacked in the vertical direction on each other.

In an example embodiment of the present inventive concept, the first spacer 400 may cover the sidewall of the bit line structure 395 in the first direction D1. For example, the first spacer 400 may entirely cover the sidewall of the bit line structure 395. The second spacer 435 may overlap along the second direction D2 a central portion of the sidewall of the bit line structure 395. For example, the second spacer 435 may vertically extend along the sidewall of the bit line structure 395.

In an example embodiment of the present inventive concept, the fourth and fifth insulation patterns 410 and 420 including silicon oxide and silicon nitride, respectively, may be stacked on each other between the first and second spacers 400 and 435.

In an example embodiment of the present inventive concept, the contact plug structure may be formed on the substrate 100 adjacent to the bit line structure 395 in the second direction D2, and may include the lower contact plug 475, the metal silicide pattern 500 and the upper contact plug 549 sequentially stacked on each other in the vertical direction. The lower contact plug 475 may include, e.g., doped polysilicon, and the upper contact plug 549 may have the first metal pattern 545, which includes, e.g., a metal, and the third barrier pattern 535, which includes, e.g., a metal nitride.

Figure 23:
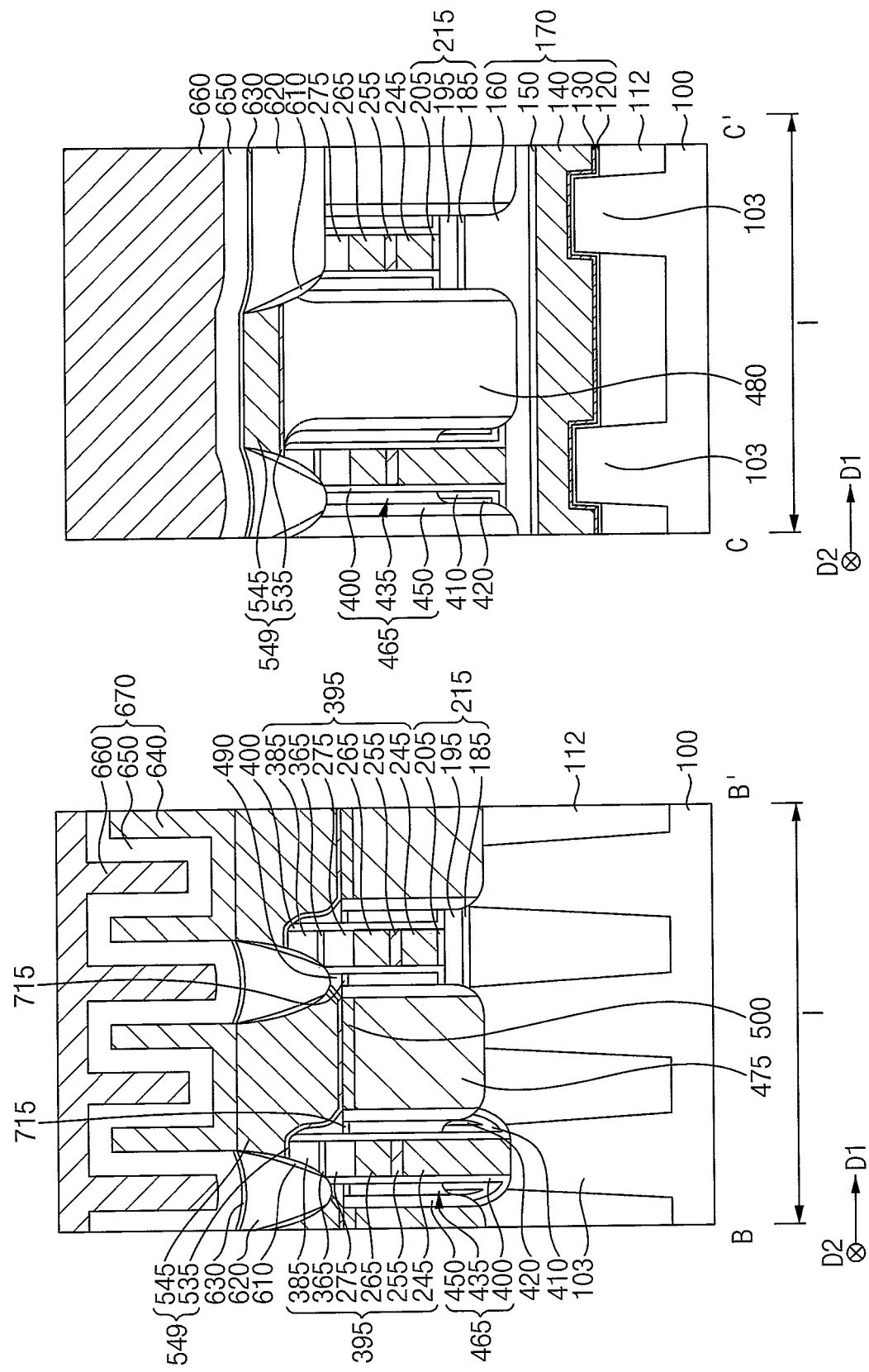
FIG. 23 is a cross-sectional view illustrating a semiconductor device according to an example embodiment of the present inventive concept.

FIG. 23 is a cross-sectional view illustrating a semiconductor device according to an example embodiment of the present inventive concept. This semiconductor device may be substantially the same as or similar to that of FIGS. 21 and 22, except for the position of the metal silicide pattern 500.

In an example embodiment of the preset inventive concept, an upper surface of the metal silicide pattern 500 may be substantially coplanar with or higher than that of the third capping pattern 715.

As illustrated above, the fifth opening 547 that may be formed by patterning the upper contact plug layer might not have a deep depth to expose the upper surface of the preliminary second spacer 430 and form the air spacer 435, and thus, the metal silicide pattern 500 might not be exposed by the fifth opening 547. Accordingly, the processes illustrated with reference to FIG. 18, that is, removing the upper portion of the lower contact plug 475 after forming the fifth spacer so as to lower the upper surface of the metal silicide pattern 500 is not needed, and thus, the upper surface of the lower contact plug 475 may have height substantially equal or similar to those of the third spacer 450 and the third capping pattern 715.

The upper surface of the metal silicide pattern 500 that is disposed on the lower contact plug 475 may be slightly higher than the upper surface of the lower contact plug 475, and thus, the upper surface of the metal silicide pattern 500 may be substantially coplanar with or slightly higher than those of the third capping pattern 715 and the third spacer 450.

FIGS. 24 to 27 are cross-sectional views illustrating a method of manufacturing a semiconductor device according to an example embodiment of the present inventive concept, and each of FIGS. 24 to 27 includes cross-sections taken along lines B-B' and C-C' of a corresponding plan view. This method may include processes substantially the same as or similar to those illustrated with reference to FIGS. 1 to 22, and repeated explanations thereof may be omitted herein.

Figure 24:
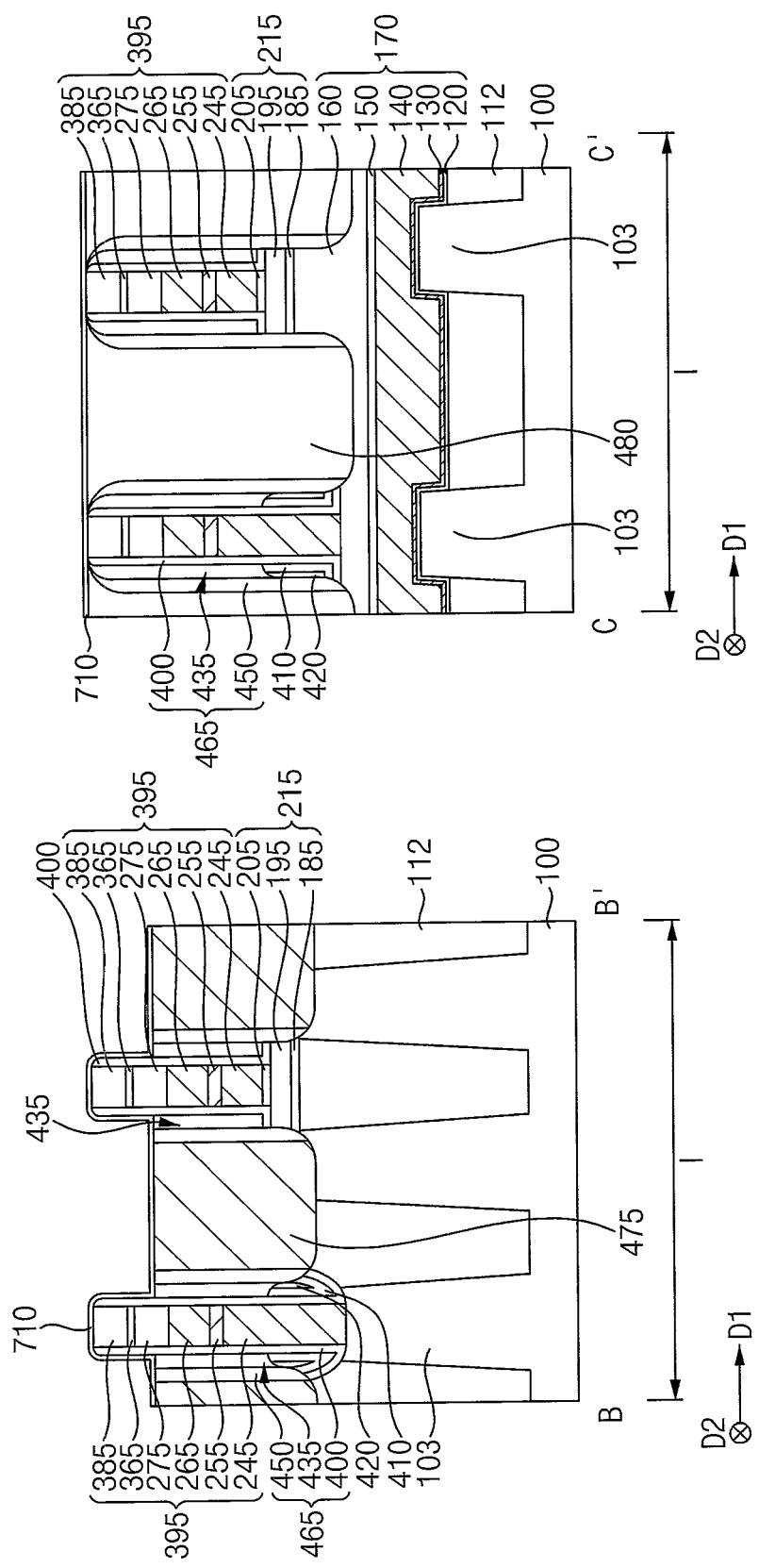

Referring to FIG. 24, processes substantially the same as or similar to those illustrated with reference to FIGS. 1 to 15 may be performed, and the third capping layer 710 may be formed by, e.g., an ALD process on the bit line structure 395, the first and third spacers 400 and 450, the first sacrificial pattern 700, the lower contact plug 475 and the second capping pattern 480.

The substrate 100 may be heated to remove the first sacrificial pattern 700 so that the second spacer 435 including air may be formed between the first and third spacers 400 and 450.

Figure 25:
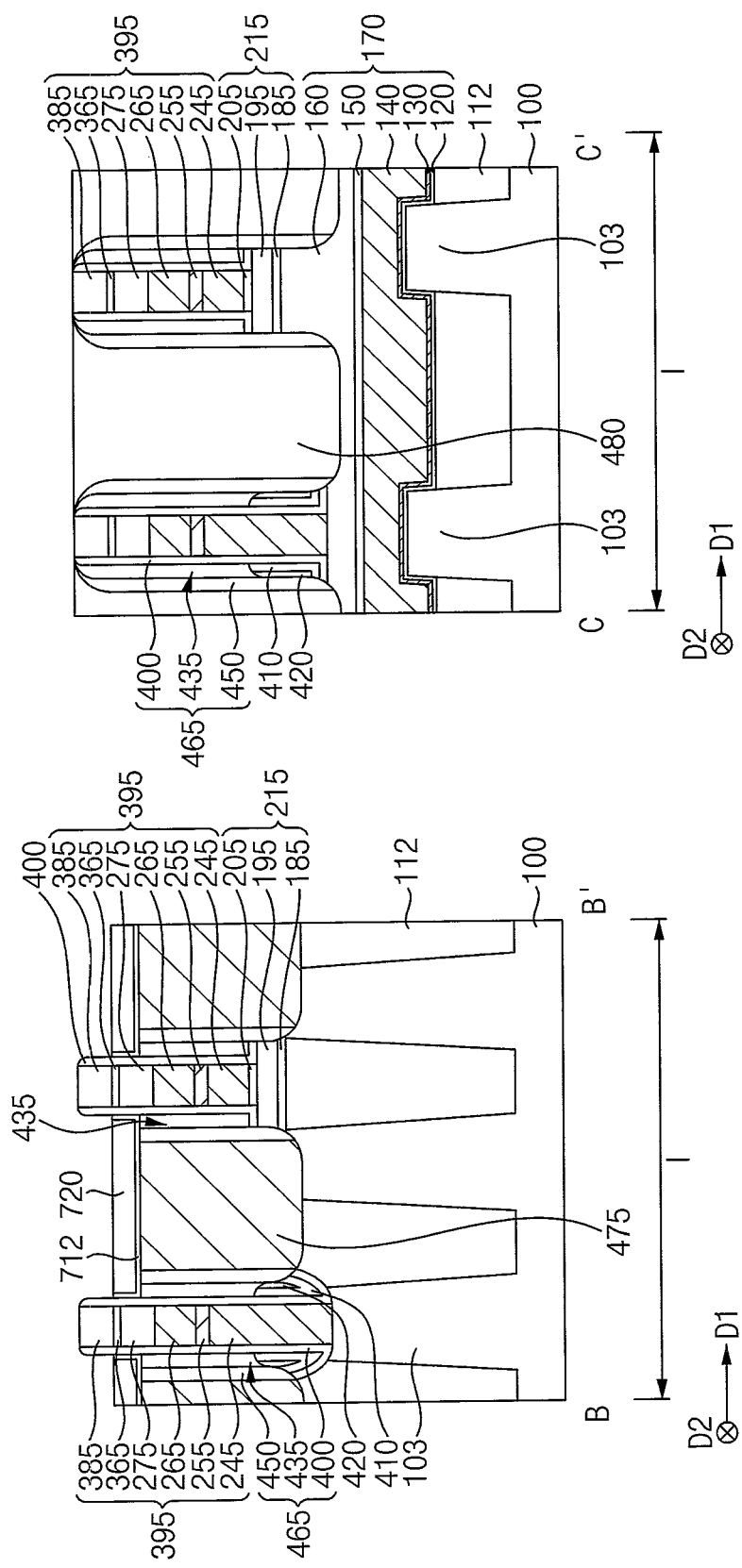

Referring to FIG. 25, a third sacrificial layer may be formed on the third capping layer 710, and an etch back process may be performed on the third sacrificial layer to remove an upper portion thereof, so that a third sacrificial pattern 720 may be formed.

A portion of the third capping layer 710 exposed by the third sacrificial pattern 720 may be removed by, e.g., a wet etching process so that a fourth capping 712, which has an upper surface substantially coplanar with the upper surface of the third sacrificial pattern 720, may be formed.

The third sacrificial pattern 720 may include, e.g., spin-on-hardmask (SOH), amorphous carbon layer (ACL), etc.

Figure 26:
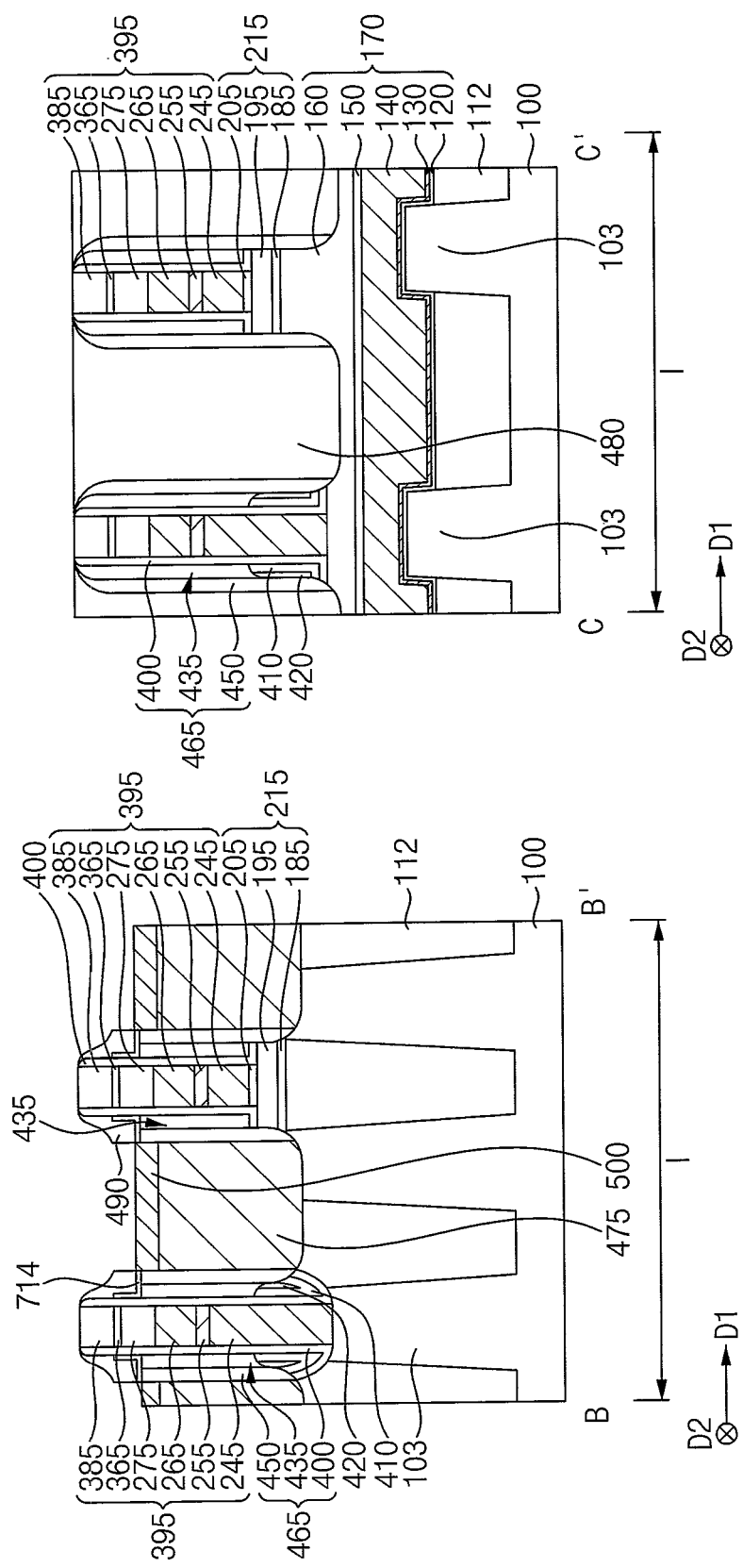

Referring to FIG. 26, the third sacrificial pattern 720 may be removed by, e.g., an ashing process and/or a stripping process to expose the fourth capping pattern 712.

Processes substantially the same as or similar to those illustrated with reference to FIG. 18 may be performed. For example, the fourth spacer layer may be formed on the bit line structure 395, the fourth capping pattern 712 and the second capping pattern 480, and may be anisotropically etched to form the fourth spacer 490 on a portion of the first spacer 400 that is on an upper sidewall of the bit line structure 395.

Not only the portion of the fourth spacer layer that is on an upper surface of the lower contact plug 475 but also a portion of the fourth spacer layer under the lower contact plug 475 may be removed to expose the upper surface of the lower contact plug 475, and thus, a fifth capping pattern 714 covered by the fourth spacer 490 may be formed on the second and third spacers 435 and 450.

The metal silicide pattern 500 may be formed on the upper surface of the lower contact plug 475, and as mentioned above, in an example embodiment of the present inventive concept, the fifth spacer may be formed on the sidewall of the fourth spacer 490 before forming the metal silicide pattern 500.

Referring to FIG. 27, processes substantially the same as or similar to those illustrated with reference to FIGS. 19 to 22 may be performed to complete the fabrication of the semiconductor device.

The semiconductor device manufactured by the above processes may include the fifth capping pattern 714 covering the upper surfaces of the second and third spacers 435 and 450. The upper surface of the metal silicide pattern 500 may be substantially coplanar with or slightly higher than the upper surfaces of portions of the second and third spacers 435 and 450 adjacent to the metal silicide pattern 500 in the first direction D1, and a lower surface of the metal silicide pattern 500 may be lower than the upper surfaces of the portions of the second and third spacers 435 and 450.

In an example embodiment of the present inventive concept, the fifth capping pattern 714 may have a cross-section in the second direction D2 having a bent shape, e.g., an "L" shape.

While the present inventive concepts have been described with reference to example embodiments thereof, it will be understood by those of ordinary skill in the art that various changes in form and details may be made thereto without departing from the spirit and scope of the present inventive concept.

What is claimed is:

1. A semiconductor device comprising:
a stack including a conductive structure and an insulation structure stacked on each other on a substrate, wherein the stack extends in a first direction substantially parallel to an upper surface of the substrate;
first, second and third spacers sequentially stacked on each other on a sidewall of the stack in a second direction substantially parallel to the upper surface of the substrate and crossing the first direction; and
a capping pattern disposed on the second spacer,
wherein:
the second spacer is an air spacer including air, and
an upper surface of a portion of the third spacer is substantially coplanar with an upper surface of the capping pattern.

2. The semiconductor device according to claim 1, wherein the first and third spacers include a nitride, and the capping pattern includes an oxide.

3. The semiconductor device according to claim 1, further comprising a fourth spacer disposed on the capping pattern and the third spacer, wherein the fourth spacer contacts an outer sidewall of the first spacer.

4. The semiconductor device according to claim 1, wherein the conductive structure includes first, second and third conductive patterns sequentially stacked in a vertical direction with respect to the upper surface of the substrate,
wherein the first conductive pattern includes doped polysilicon, wherein the second conductive pattern includes a metal nitride, and wherein the third conductive pattern includes a metal.

5. The semiconductor device according to claim 1, wherein the insulation structure includes first, second and third insulation patterns sequentially stacked in a vertical direction with respect to the upper surface of the substrate, and
wherein each of the first to third insulation patterns includes silicon nitride.

6. The semiconductor device according to claim 1, wherein the first spacer entirely covers the sidewall of the stack in the second direction, and the second spacer overlaps in the second direction a central sidewall of the stack.

7. The semiconductor device according to claim 6, further comprising first and second insulation patterns disposed between the first spacer and the second spacer,
wherein the first insulation pattern includes silicon oxide, and the second insulation pattern includes silicon nitride.

8. The semiconductor device according to claim 1, further comprising a contact plug structure disposed on a portion of the substrate adjacent to the stack in the second direction,
wherein the contact plug structure includes a lower contact plug, a metal silicide pattern and an upper contact plug sequentially stacked on each other in a vertical direction with respect to the upper surface of the substrate.

9. The semiconductor device according to claim 8, wherein an upper surface of the metal silicide pattern is substantially coplanar with or higher than an upper surface of the capping pattern.

10. A semiconductor device comprising:
an active pattern disposed on a substrate;
a gate structure buried in an upper portion of the active pattern, wherein the gate structure extends in a first direction parallel to an upper surface of the substrate;
a bit line structure disposed on the active pattern and extending in a second direction parallel to the upper surface of the substrate and substantially perpendicular to the first direction;
first, second and third spacers sequentially stacked on each other in the first direction on a sidewall of the bit line structure;
a capping pattern disposed on the second spacer;
a fourth spacer disposed on the capping pattern and the third spacer, wherein the fourth spacer contacts an outer sidewall of the first spacer;
a contact plug structure disposed on an upper surface of each end portion of the active pattern; and
a capacitor disposed on the contact plug structure,
wherein:
the second spacer is an air spacer including air, and
an upper surface of a portion of the third spacer, which is adjacent to the capping pattern, is substantially coplanar with an upper surface of the capping pattern.

11. The semiconductor device according to claim 10, wherein the contact plug structure includes a lower contact plug, a metal silicide pattern and an upper contact plug sequentially stacked on each other, and
wherein an upper surface of the metal silicide pattern is substantially coplanar with or higher than the upper surface of the capping pattern.

12. The semiconductor device according to claim 10, wherein the bit line structure includes a conductive structure and an insulation structure stacked on each other on the substrate, and
wherein the first spacer entirely covers the sidewall in the second direction, and the second spacer overlaps in the second direction a central sidewall of the bit line structure.

* * * * *